(12) United States Patent
Khare et al.

(10) Patent No.: US 9,352,416 B2
(45) Date of Patent: May 31, 2016

(54) NIOBIUM BASED SUPERCONDUCTING RADIO FREQUENCY(SCRF) CAVITIES COMPRISING NIOBIUM COMPONENTS JOINED BY LASER WELDING, METHOD AND APPARATUS FOR MANUFACTURING SUCH CAVITIES

(75) Inventors: Prashant Khare, Indore (IN); Brahma Nand Upadhyay, Indore (IN); Sindhunil Barman Roy, Indore (IN); Chandrakant Pithawa, Trombay (IN); Vinod Chandra Sahni, Mumbai (IN); Purushottam Das Gupta, Indore (IN); Pradeep Kumar Kush, Indore (IN)

(73) Assignee: THE SECRETARY, DEPARTMENT OF ATOMIC ENERGY, GOVT. OF INDIA, Maharastra (IN)

( * ) Notice: Subject to any disclaimer, the term of this patent is extended or adjusted under 35 U.S.C. 154(b) by 728 days.

(21) Appl. No.: 13/377,597

(22) PCT Filed: Nov. 3, 2009

(86) PCT No.: PCT/IN2009/000621
§ 371 (c)(1),
(2), (4) Date: Dec. 12, 2011

(87) PCT Pub. No.: WO2011/055373
PCT Pub. Date: May 12, 2011

(65) Prior Publication Data
US 2012/0094839 A1  Apr. 19, 2012

(51) Int. Cl.
*H01L 39/12* (2006.01)
*H01L 39/24* (2006.01)
(Continued)

(52) U.S. Cl.
CPC ......... *B23K 26/1224* (2015.10); *B23K 26/0823* (2013.01); *B23K 26/106* (2013.01); *B23K 26/12* (2013.01); *B23K 26/127* (2013.01);
(Continued)

(58) Field of Classification Search
CPC .. B23K 26/0823; B23K 26/127; B23K 26/12; B23K 26/122; B23K 26/147; B23K 26/285; B23K 26/32; B23K 26/422; B23K 37/0435; B23K 37/0533; B23K 26/106; B23K 2203/08; H01L 39/14; H01L 39/2406; H05H 7/20
USPC ............. 219/121.6, 121.63, 121.64; 505/210, 505/480, 801, 805, 806; 333/227
See application file for complete search history.

(56) References Cited

U.S. PATENT DOCUMENTS 2,981,823 A * 4/1961 Candidus ................. 219/121.13
3,303,319 A * 2/1967 Steigerwald ............. 219/121.17
(Continued)

*Primary Examiner* — Eric Stapleton
(74) *Attorney, Agent, or Firm* — The PL Law Group, PLLC

(57) ABSTRACT

Niobium or its alloy based Superconducting Radio Frequency (SCRF) Cavities involving atleast one laser beam welded components in the SCRF cavity welded from inside surface of the wall of cavity directed to achieving more than half the thickness to full depth penetration with minimum HAZ, minimizing distortion and shrinkage. The method ensures improved weld quality and surface finish substantially free of any weld defects. Also disclosed is the welding nozzle system and welding rigs adapted to facilitate such laser welding of the Niobium or its alloy based Superconducting Radio Frequency (SCRF) Cavities. The invention is thus directed to enhancing productivity, ensuring consistent quality and reliability, enhanced weld penetration with minimum HAZ, smooth finish of weld joints at possible reduced costs.

16 Claims, 10 Drawing Sheets

Figure 1:
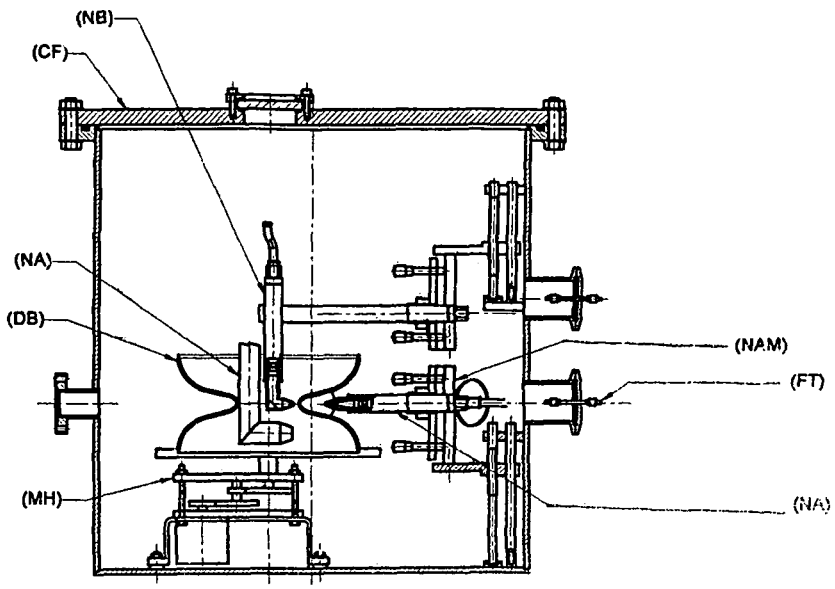

(51) Int. Cl.
*B23K 26/00* (2014.01)
*B23K 26/08* (2014.01)
*B23K 26/10* (2006.01)
*B23K 26/12* (2014.01)
*B23K 26/14* (2014.01)
*B23K 26/32* (2014.01)
*B23K 37/04* (2006.01)
*B23K 37/053* (2006.01)
*H01L 39/14* (2006.01)
*H05H 7/20* (2006.01)

(52) U.S. Cl.
CPC ............ *B23K26/147* (2013.01); *B23K 26/282* (2015.10); *B23K 26/32* (2013.01); *B23K 26/702* (2015.10); *B23K 37/0435* (2013.01); *B23K 37/0533* (2013.01); *H01L 39/14* (2013.01); *H01L 39/2406* (2013.01); *H05H 7/20* (2013.01); *B23K 2203/08* (2013.01)

(56) References Cited

U.S. PATENT DOCUMENTS

| | | | | |
|---|---|---|---|---|
| 3,364,087 A * | 1/1968 | Solomon et al. | 216/73 |
| 3,441,880 A * | 4/1969 | Ira et al. | 333/99 R |
| 3,617,939 A * | 11/1971 | Bond et al. | 372/69 |
| 4,078,919 A * | 3/1978 | Kado et al. | 148/326 |
| 4,115,916 A * | 9/1978 | Meyerhoff | 29/599 |
| 4,359,486 A * | 11/1982 | Patalong et al. | 438/661 |
| 4,525,379 A * | 6/1985 | Hubner et al. | 427/586 |
| 4,598,039 A * | 7/1986 | Fischer et al. | 430/323 |
| 4,803,334 A * | 2/1989 | Burke et al. | 219/121.64 |
| 4,826,317 A * | 5/1989 | Ellenrieder et al. | 356/241.1 |
| 4,992,643 A * | 2/1991 | Fuerschbach et al. | 219/121.63 |
| 5,239,157 A * | 8/1993 | Sakano et al. | 219/121.64 |
| 5,347,242 A * | 9/1994 | Shimano et al. | 333/99 S |
| 5,407,119 A * | 4/1995 | Churchill et al. | 228/124.5 |
| 5,409,889 A * | 4/1995 | Das | 505/210 |
| 5,451,567 A * | 9/1995 | Das | 505/210 |
| 5,459,123 A * | 10/1995 | Das | 505/210 |
| 5,517,420 A * | 5/1996 | Kinsman et al. | 700/166 |
| 5,586,961 A * | 12/1996 | Quint | 482/111 |
| 5,610,567 A * | 3/1997 | Phillips et al. | 333/252 |
| 5,659,479 A * | 8/1997 | Duley et al. | 700/166 |
| 5,679,624 A * | 10/1997 | Das | 505/210 |
| 5,703,020 A * | 12/1997 | Das | 505/210 |
| 5,760,365 A * | 6/1998 | Milewski et al. | 219/121.64 |
| 5,869,429 A * | 2/1999 | Das | 505/210 |
| 5,877,123 A * | 3/1999 | Das | 505/210 |
| 5,908,811 A * | 6/1999 | Das | 505/210 |
| 5,932,522 A * | 8/1999 | Bell et al. | 505/210 |
| 5,968,876 A * | 10/1999 | Sochor | 505/210 |
| 6,014,575 A * | 1/2000 | Miura | 505/210 |
| 6,029,075 A * | 2/2000 | Das | 505/210 |
| 6,076,001 A * | 6/2000 | Das | 505/210 |
| 6,086,726 A * | 7/2000 | Renk et al. | 204/192.1 |
| 6,097,153 A * | 8/2000 | Brawley et al. | 315/5.41 |
| 6,111,213 A * | 8/2000 | Suchier | 219/121.63 |
| 6,262,387 B1 * | 7/2001 | Chang | 219/121.63 |
| 6,388,227 B1 * | 5/2002 | Dykhno et al. | 219/121.6 |
| 6,410,882 B1 * | 6/2002 | Okada | 219/121.64 |
| 6,429,402 B1 * | 8/2002 | Dixon et al. | 219/121.63 |
| 6,526,327 B2 * | 2/2003 | Kar et al. | 700/119 |
| 6,548,125 B2 * | 4/2003 | Warnecke | 427/597 |
| 6,548,176 B1 * | 4/2003 | Gwo | 428/420 |
| 6,580,310 B2 * | 6/2003 | Herr | 327/528 |
| 6,752,685 B2 * | 6/2004 | Ulrich et al. | 451/2 |
| 6,753,538 B2 * | 6/2004 | Musil et al. | 250/492.2 |
| 6,770,840 B2 * | 8/2004 | Minamida et al. | 219/121.64 |
| 6,846,221 B2 * | 1/2005 | Ulrich et al. | 451/2 |
| 6,911,262 B2 * | 6/2005 | Sallavanti et al. | 428/411.1 |
| 7,009,139 B2 * | 3/2006 | Sonoda et al. | 219/121.64 |
| 7,019,256 B2 * | 3/2006 | Sonoda et al. | 219/121.63 |
| 7,022,939 B2 * | 4/2006 | Yahaba et al. | 219/121.64 |
| 7,144,768 B2 * | 12/2006 | Chung | 438/239 |
| 7,276,136 B2 * | 10/2007 | Sallavanti et al. | 156/379.6 |
| 7,288,737 B2 * | 10/2007 | Briand | 219/121.64 |
| 7,391,850 B2 * | 6/2008 | Kaertner et al. | 378/118 |
| 7,521,017 B2 * | 4/2009 | Kunze et al. | 419/8 |
| 7,663,077 B1 * | 2/2010 | Smith et al. | 219/601 |
| 7,671,306 B1 * | 3/2010 | Smith et al. | 219/601 |
| 8,042,258 B2 * | 10/2011 | Sennyu et al. | 29/599 |
| 8,088,714 B2 * | 1/2012 | Singer et al. | 505/300 |
| 8,463,342 B2 * | 6/2013 | Norem et al. | 505/210 |
| 2003/0038120 A1 * | 2/2003 | Minamida et al. | 219/121.64 |
| 2003/0047691 A1 * | 3/2003 | Musil et al. | 250/492.2 |
| 2003/0117229 A1 * | 6/2003 | Remillard | 333/99 S |
| 2003/0136768 A1 * | 7/2003 | Sonoda et al. | 219/121.64 |
| 2003/0194950 A1 * | 10/2003 | Ulrich et al. | 451/38 |
| 2003/0227349 A1 * | 12/2003 | Matsui et al. | 333/99 S |
| 2004/0026381 A1 * | 2/2004 | Tsukamoto et al. | 219/121.6 |
| 2004/0084425 A1 * | 5/2004 | Yahaba et al. | 219/121.64 |
| 2004/0232130 A1 * | 11/2004 | Sonoda et al. | 219/137 R |
| 2004/0251140 A1 * | 12/2004 | Chung | 205/50 |
| 2006/0054603 A1 * | 3/2006 | Briand | 219/121.64 |
| 2006/0228634 A1 * | 10/2006 | Bret et al. | 430/5 |
| 2006/0251217 A1 * | 11/2006 | Kaertner et al. | 378/119 |
| 2007/0275860 A1 * | 11/2007 | Sennyu et al. | 505/400 |
| 2007/0290517 A1 * | 12/2007 | Nagai et al. | 294/64.1 |
| 2008/0116175 A1 * | 5/2008 | Ballerini et al. | 219/74 |
| 2008/0296272 A1 * | 12/2008 | Lei et al. | 219/121.69 |
| 2008/0314877 A1 * | 12/2008 | Cremerius et al. | 219/121.46 |
| 2009/0047752 A1 * | 2/2009 | Yamazaki et al. | 438/96 |
| 2009/0134132 A1 * | 5/2009 | Verna et al. | 219/121.64 |
| 2009/0215631 A1 * | 8/2009 | Singer et al. | 505/480 |
| 2009/0312186 A1 * | 12/2009 | Norem et al. | 505/210 |
| 2010/0282723 A1 * | 11/2010 | Chouf et al. | 219/121.64 |
| 2011/0042361 A1 * | 2/2011 | Nowak et al. | 219/121.64 |

\* cited by examiner

SECTION-AA
(DURING FINISHING WELD)
(SECOND OPERATION)

SECTION-AA

THE HOM COUPLER

THE NbTi RING

THE COUPLER FLANGE

NIOBIUM BASED SUPERCONDUCTING RADIO FREQUENCY(SCRF) CAVITIES COMPRISING NIOBIUM COMPONENTS JOINED BY LASER WELDING, METHOD AND APPARATUS FOR MANUFACTURING SUCH CAVITIES

CROSS REFERENCE TO RELATED APPLICATION

The present application claims all benefits accruing under 35 U.S.C. §365(c) from the PCT International Application PCT/IN2009/000621, with an International Filing Date of Nov. 3, 2009, which claims the priority the entire contents of which are incorporated herein by reference.

FIELD OF THE INVENTION

The present invention relates to superconducting Radio Frequency (SCRF) Cavity and, in particular, to the fabrication of superconducting Radio Frequency (SCRF) Cavity involving laser welding with possible at least one welded joint welded from inside surface of the wall of the cavity to a depth of even more than half the thickness to full depth of the components welded with good strength and improved weld characteristics of the joints. More particularly, the invention is directed to Niobium and/or kits alloy based superconducting Radio Frequency (SCRF) Cavity fabrication involving possible laser weld from inside surface of the wall of cavity to more than half the thickness to full penetration for joints in the RF field region or in RF field free region as the case may be, which is directed to favor obtaining such weld joints much simpler with easy handling and manufacturing steps. Importantly, the invention is directed to selective pulsed laser beam welding of the Niobium and its alloy based components for the fabrication of SCRF cavity with selective combinations of keyhole and conduction welding to achieve large penetration depth with minimum heat affected zone (HAZ), minimizing distortion and shrinkage, reduced weld time and costs by way of mechanized/automated weld execution with more controlled precision and weld characteristics to benefit end uses as SCRF cavity with improved weld quality and surface finish, particularly surface free of weld defects/cracks that is highly detrimental for the SCRF cavity. The invention is further directed to enable bulk fabrication of SCRF cavities by laser welding of Niobium components in a system with enhanced productivity, ensuring consistent quality and reliability, enhanced weld penetration with minimum HAZ, smooth finish of weld joints, in weld rigs adapted to suit such high performance laser welding with enhanced productivity, quality and reliability at reduced cost.

BACKGROUND ART

It is well known in the related field that the superconducting radio frequency (SCRF) cavities are used to accelerate particle beams in high-energy particle accelerators. These are in operation for last 30-35 years. SCRF cavities have the advantage of operating at high gradients, negligible AC power demand and favorable beam dynamics. The present day technology for manufacturing of these SCRF cavities is highly complex and expensive. Most of the SCRF cavities are presently made from bulk niobium material involving a fabrication process, which is exorbitantly costly and complex.

It is also known in the art that during the manufacturing of such cavities, niobium components are joined by electron beam welding (EBW) process. However, the existing electron beam welding (EBW) process is applied to weld both types of joints of SCRF cavities: those which are exposed to RF field and those that fall outside RF field region; these have been termed as joints in RF field region and joints in R.F. field free region respectively in the embodiments. Conventional EBW process used for fabrication of the SCRF cavities suffers from following drawbacks:

a) It is an expensive process as it has to be performed in vacuum and the Capital cost of the EBW machine is very high.

b) Chemical etching required before every electron beam welding operation is an expensive and hazardous operation, which, needs to be minimized, if not eliminated.

c) In order to weld intricate joints, complicated manipulation of electron beam or parts to be welded is required. Hence intricate joints are difficult to make with this process.

Joints made in SCRF cavities with EB welding, cause significant amount of mechanical distortion and shrinkage.

It has also been experienced in the art that to weld Nb components for SCRF cavity having high thickness (1 mm or above), the energy deposited per unit time is high in case of EBW and as a consequence the possibility of distortion or shrinkage is high. Moreover, weld joints located in the RF field region of the SCRF cavity require extremely smooth surface finish, since presence of any sharp points on weld bead can cause field emission. This is difficult to achieve with existing high energy EBW weld process consistently, which causes detrimental effects on performance of SCRF cavities so fabricated. The existing EBW weld process does not also provide on-line, means for inspection of weld fit up, progress and finished weld bead. The electron beam welding process as being applied today makes it necessary that weld operations are carried out in many settings and hence vacuum has to be broken many times which means more time and cost. Also the existing weld systems and methods applied in the SCRF cavity fabrication do not suggest any method for removal of evaporating plasma material due to electron beam material interaction from weld surface and a method for smoothening for the intricate weld joints in precise weld set-up for the SCRF cavity. The existing EBW welding process applied for fabrication of the Niobium components of the SCRF cavity is thus expensive, low in productivity and consistency in weld quality for Nb components.

U.S. Pat. No. 5,239,157 discloses a superconducting accelerating tube which is constructed in a manner such that a plurality of components, formed of a superconducting material and individually having peripheral end portions adapted to be butted to one another, are butted to one another at the peripheral end portions, and the butting portions butted to one another are welded together. In the superconducting accelerating tube according to the said '157, the butting portions are welded by means of a laser beam, and the laser beam is applied to the butting portions such that the components are laser-welded to one another. Preferably, the accelerating tube is designed so that at least only the respective inner surfaces of the butting portions are laser-welded, and the depth of welding is not greater than half the thickness of the superconducting material and not smaller than 150 μm.

Importantly the said U.S. Pat. No. '157 suggested that it was preferred that the weld thickness should not be more than half the thickness of the sheet. Particularly, it was stated in the said prior art that if the depth of welding was greater than half the thickness of the superconducting material, the dimensional accuracy of the manufactured superconducting accelerating tube was lowered by a contraction of the weld portion. It was further mentioned under the said prior art that if the thickness of the superconducting material was smaller than 0.1 mm, the strength of the resulting superconducting accelerating tube was too low and the wall of the tube would be too thin for satisfactory laser welding and if the thickness of the superconducting material was greater than 1 mm on the other hand, the thermal conductivity was low and inevitably therefore the cooling efficiency obtained during the use of the superconducting accelerating tube was low.

Thus it would be clearly apparent from the above teachings flowing from the US prior art that under said art the thickness of material "t" for weld was restricted in the region of $0.1 \leq t \leq 1$ mm and moreover the weld had to have a limitation of not exceeding beyond half the said thickness. However, usually the cavity wall thickness for the purposes of SCRF cavities have over the years been in the range of about 2 mm and more and in the present day elliptical type SCRF cavities are generally made of Nb with thickness of typically 3 mm. Hence the said prior art on laser welding could not be applied in the industry which is manufacturing superconducting cavities.

It would also be clearly apparent from the above state-of-the-art that while the present day requirement of Nb based SCRF cavity fabrication requires a wall thickness of 2 mm and above, the laser welding of less than half the depth and up to 1 mm wall thickness proposed in the U.S. Pat. No. 5,239,157 was not sufficient to provide for weld joints with desired strength and other characteristics for Nb based SCRF cavities. Moreover, the laser weld of SCRF cavities proposed in the U.S. Pat. No. '157 could never have provided for proper weld joints involving the standard thickness of Nb of 2 mm or more used for fabricating SCRF cavities. In particular attempting to achieve greater depth of welding beyond the less than half depth of even less than 1 mm thickness attempted and proposed in the US involving higher power lasers would have invariably resulted in serious failure of the weld joints in terms of high HAZ, large weld distortion and shrinkage.

There has, therefore, been a continuing requirement in the related field to advance the technology of manufacturing/fabricating SCRF accelerator cavities involving laser welding in order to achieve higher reliability and productivity and simultaneously bring down the manufacturing time and costs, to make the process and equipments affordable as well as ensuring reliable weld performance for fabrication of SCRF cavities. Involving Niobium and its alloy based components with possibility of achieving welding from inside surface of the wall of cavity to more than half the thickness to even full depth of thickness which was not possible here to before. Moreover, for such weld penetration using laser beam it has been desirable to meet some of the critical requirements like good surface finish, strength and freedom from risks of field emission so that consistent performance from the RF joints can be obtained while in service for charged particle acceleration in these cavities. The other requirement in the art over the years had been of meeting high penetration with minimized HAZ to ensure reliable weld quality with high surface finish free of presence of any sharp points in weld surface to avoid field emission, which is not attainable by the existing EBW process consistently. Above all, the intricacies and weld finish coupled with strength, smoothness of weld bead that is required in particular for the RF field region of the SCRF cavity, needed to be met by proper selection of process and equipments, designing of the weld process and optimization of parameters thereof to achieve economy, attaining user-friendly provisions for such laser welding of SCRF cavity joints have been the challenging constraints to adopting laser weld technique for such fabrication of Nb based SCRF cavities.

OBJECTS OF THE INVENTION

It is thus the basic object of the present invention to provide for Niobium based superconducting radio frequency (SCRF) cavities comprising Niobium and/or its alloy based components joined by laser welding in the RF field region involving required strength and desired weld characteristics to suit reliable performance of cavity for accelerating charged particles and desired superconducting properties free of any field emission, especially by way of providing at east one weld joint of at least over half the thickness to full depth penetration of the material being welded from inside surface of the wall of the cavity.

Another object of the present invention is to develop a system and method for welding of niobium and its alloy based components cost effectively and also reducing functional difficulties in fabrication of such SCRF cavities with enhanced productivity and consistent quality and reliability, involving laser welding adapted to overcome the limitations of the known laser weld method as well as the conventionally followed EBW process used for such purposes.

A further object of the present invention is directed to developing a system for laser welding of Nb sheet/components for fabrication of SCRF cavity comprising full penetration weld joints in RF field region in the cavity, by a technique involving selective combination of keyhole and conduction welding to achieve desired depth of welding and also advantage of smooth weld bead and ease in collection of evaporated plasma material produced due to laser material interaction, so that there remains minimum chance of presence of any sharp point on weld surface causing undesired field emission in SCRF cavity.

A further object of the present invention is directed to developing a method for laser welding of Nb sheet/components for fabrication of SCRF cavity comprising laser welding of any type of cavity viz. quarter wave resonator (QWR), half wave resonator (HWR), Re-entrant type, elliptical type and the like SCRF cavity.

Yet another object of the present invention is directed to the provision of system of weld rigs which are configured preferably to weld elliptical type cavities with the desired atleast one weld joint of at least over half the thickness to full depth penetration of the material being welded from inside surface of the wall of the cavity.

A further object of the present invention is directed to developing a system for laser welding of Nb sheet/components for fabrication of SCRF cavity capable of achieving full penetration weld having more than 1 mm thickness and up to full depth of thickness of Nb components with narrow HAZ, minimum distortion and shrinkage while achieving desired strength requirements of such cavity.

A further object of the present invention is directed to developing a system for laser welding of Nb sheet/components for fabrication of SCRF cavity and a method thereof comprising use of selective weld parameters such that high penetration and minimum HAZ is achieved, by selection of process and optimization of weld parameters including designing preferred pulse configuration in temporal and spatial domain and frequency of its repetition.

A further object of the present invention is directed to developing a system for laser welding of Nb sheet/components for fabrication of SCRF cavity and a method thereof comprising welding of joints in the RF field region involving smooth weld surface from inside surface of the wall of cavity e.g. the inside surface of the wall of butt weld joints of iris and equator joints of SCRF cavity, and involving provision for required weld of some joints from outside surface of the wall in case of joints in the RF field free region.

A further object of the present invention is directed to developing a method and system for laser welding of Nb sheet/components for fabrication of SCRF cavity for welding of joints from inside surface of the wall of cavity especially for the joints in RF field region and also in the RF field free region involving good strength and leak tightness, A still further object of the present invention is directed to developing a system for laser welding of Nb sheet/components for fabrication of SCRF cavity wherein the weld joints surface is cleaned using selective low energy and high frequency pulse for desired faster laser cleaning and removing the evaporated plasma material due to laser material interaction from weld surface, minimizing conventional chemical cleaning which is time taking, hazardous and costly.

A still further object of the present invention is directed to developing a system for laser welding of Nb sheet/components for fabrication of SCRF cavity involving a selective nozzle configuration adapted to carry out the task of laser welding as well as providing a gas jet and selective suction mechanism to suck out of evaporating plasma material due to laser material interaction by means of a vacuum pump connected to the concentric annular passage inside the nozzle tip or by separate enclosures in case of joints in RF field or RF field free region as these are being welded by nozzle/nozzles inclined to the vertical so as to favor collection and disposal of the plumes/debris generated at weld site.

A still further object of the present inventions directed to developing a system for laser welding of Nb sheet/components for fabrication of SCRF cavity involving a set of welding rigs configured with mechanized means to function as manipulator to favor carrying out precise welding in selective weld locations of SCRF cavity fabrication, including means for pre and post weld on-line inspection of joints from outside of cavity, facilitating faster and bulk production for enhancing productivity, including carrying out weld rectification as necessary.

Yet another object of the present invention is directed to superconducting cavities involving niobium and its alloy based joined components which would be adapted to mitigate problems of weld distortion and weld shrinkage in obtaining of such full depth penetration of laser welded joints from inside surface of the wall of SCRF cavities and means for on-line monitoring/control of distortion due to weld.

Another object of the present invention is directed to the manufacture of superconducting cavities involving niobium and its alloy based welded joined components which would enable joining of intricate shaped parts in such cavities with simplicity and cost-effectively.

A further object of the present invention is directed to a system and a method for carrying out selective simple and cost-effective welding of niobium components for fabrication of SCRF cavities, which would involve less capital cost or operating costs and ensure superior quality of SCRF cavities.

A still further object of the present invention is directed to a system and method for selective welding of R.F. field region of the niobium based components for fabrication of SCRF cavities wherein said selective welding could be carried out under vacuum or in an inert gas atmosphere.

A further object of the present invention is directed to a system and method for selective welding of the niobium based components for fabrication of SCRF cavities, which would enable obtaining fabrication of intricate shapes with desired accuracy/precision.

A still further object of the present invention is directed to a system and method for carrying out a selective laser welding of Niobium based components for the SCRF cavities specifically suitable for RF field region, wherein the weld process would ensure full thickness penetration, minimum weld distortion and shrinkage due to welding, narrow HAZ, smooth weld surface free of field emission and in turn favor ensuring required dimensional accuracy as well as reliable performance of the cavity in accelerating charged particles.

A still further object of the present invention is directed to a system and method for laser welding of niobium components for fabrication of SCRF cavity, wherein for carrying out the welding of joints involve provision for boroscopic inspection/viewing of the weld region from remote location for proper control on weld parameters for achieving desired weld quality.

SUMMARY OF THE INVENTION

Thus according to the basic aspect of the present invention the same is directed to providing Niobium or it's alloys based superconducting radio frequency (SCRF) cavities, comprising of at least one component made of Niobium or it's alloys which are joined by laser welding from inside surface of the wall of the cavity with depth of penetration of welding ranging from greater than half the thickness to full depth of the material being welded.

Another aspect of the present invention is directed to Niobium or it's allow, based superconducting radio frequency (SCRF) cavities comprising iris joints and equator joints in the RF field region formed by laser welding from inside surface of the wall of the cavity with depth of penetration of welding ranging from greater than half the thickness to full depth of the materials being welded.

A further aspect of the present invention is directed to said Niobium or it's alloys based superconducting radio frequency (SCRF) cavities wherein anyone or more of said equator and/or iris joints comprise full depth laser welding from inside surface of the wall of the cavity.

Importantly, in said Niobium or it's alloys based super conducting radio frequency (SCRF) cavities wherein said thickness of the laser weld joint from inside surface of the wall of the cavity is greater than 1 mm.

A still further aspect of the present invention is directed to said Niobium or it's alloys based super conducting radio frequency (SCRF) cavities comprising single and/or multi cell SCRF cavity for charged particle acceleration.

A further aspect of the present invention is directed to said Niobium or it's alloys based super conducting radio frequency (SCRF) cavities comprising elliptical shaped Niobium or it's alloys based super conducting radio frequency (SCRF) cavities wherein said laser weld joints comprise anyone or more of laser weld dumbbells produced from half cells, end group components welded to end group main body including flanges and higher order mode (HOM) couplers, weld joints in the RF field free regions including stiffening rings welded from outside and RF field region joints including Equator joints and iris joints welded from inside surface of they wall of the said cavity.

According to yet another aspect of the present invention is directed to a method of producing Niobium based superconducting radio frequency (SCRF) cavities comprising:

providing atleast one component made of Niobium or it's alloys joined by laser welding from Inside surface of the wall of the cavity with depth of welding ranging from greater than half the thickness to full depth of the material being welded following the steps of (i) a first phase of controlled keyhole welding from inside surface of the wall of cavity followed by (ii) a second phase of conduction welding, to achieve very smooth finish of the weld joint minimizing distortion and shrinkage with narrow HAZ and weld surface finish adapted for achieving reliable operation of SCRF cavity.

In the above method wherein said step of carrying out keyhole welding comprises depositing major energy in keyhole welding phase comprising:

i) providing only requisite amount of energy and controlling the rate of heating by keeping pulse frequency low, and ii) depositing energy with variation in time domain.

A still further aspect of the present invention is directed to said method comprising carrying out laser welding of the iris from Inside surface of the wall of cavity of the iris joint between two half cells to form dumbbells of SCRF cavity comprising:

providing the half-cells held together in an iris welding rig comprising a vacuum vessel;

carrying out in the first phase (i) keyhole welding from inside surface of the wall of cavity in RF field region involving a nozzle having three concentric cylindrical tubes the laser beam passing through the innermost tube, the outermost tube supplying gas at high velocity and the middle tube connected to suction port, selecting the welding parameters such that pulse profile is varied in time phase to get high penetration with low distortion; followed by (ii) in the second phase carrying out the laser welding involving inclined nozzles brought at the level of joint wherein the beams are inclined and the weld plume rises perpendicular to the surface, the evaporated material formed because of laser material interaction being sucked out through a material suction arrangement in form of an enclosure.

A still further aspect of the present invention is directed to said method comprising carrying out laser welding of the equator joint of single cell cavity or dumbbells constituting the multi cell SCRF cavity from inside surface of the wall of cavity comprising:

providing the dumbbelis in insert carrying the same inside an equator welding rig comprising a vacuum vessel with devices and/or attachments for carrying out the welding from inside surface of the wall of the cavity;

welding the equator joints one after the other performing a two step welding operation comprising:

(i) in the first phase carrying out keyhole welding with a laser beam inclined at an angle to the vertical in the plane of welding, the energy being varied in time phase for better penetration and followed by (ii) in the second phase carrying out conduction welding involving dual beam in order to obtain a very smooth finish after keyhole-welding operation is over, the evaporated material from laser material interaction rising up perpendicular to the surface of the joint and being collected by an enclosure.

A further aspect of the present invention is directed to said method wherein the welding methodology comprises of the sequence, viewing butting edges—keyhole welding—viewing—repairing—viewing—dual beam conduction welding/smoothening—viewing the entire region with boroscope—laser cleaning—final smoothening with defocused laser—final inspection with boroscope. In the above method wherein said keyhole welding is carried out involving a welding nozzle comprising three concentric tube type enclosure adapted to move up and down, the outermost end inner most tube enclosure adapted to provide high velocity inert gas to flow out whereas the middle enclosure is adapted to suck out the evaporated material due to laser material interaction and wherein said conduction welding is carried out involving the dual beam whereby the evaporated material as a result of the laser material, interaction rises up perpendicular to the surface of the joint and is collected by a separate enclosure adapted to move up and down.

Also in said method wherein the joints of end group component, which are in RF field free region are welded from outside involving, keyhole welding only and the ones, which are in RF field region are welded by a combination of conduction and keyhole welding According to yet another aspect of the present invention, said method of producing Niobium based superconducting radio frequency (SCRF) cavities wherein Nd:YAG or any other solid state laser is used for laser welding.

A further aspect of the present invention is directed to said method of producing Niobium based super conducting radio frequency (SCRF) cavities comprising carrying out of said laser welding for maximizing depth of penetration and minimizing distortion, shrinkage and heat affected zone (HAZ), involving temporal variation in energy within the pulse and selective repetition rate of the said laser pulse.

A still further aspect of the present invention is directed to said method of producing Niobium based super conducting radio frequency (SCRF) cavities wherein the temporal profile of the pulse is tailored for Niobium or its alloys preferably by varying the energy within the pulse in time domain in a near trapezoidal shape such that initial preheating of surface results in higher penetration and the tapering off the energy near the end is done in such a way to avoid micro cracks/porosity/other defects, whereby the overall pulse shape ensures high penetration depth and low heat affected zone.

A still further aspect of the present invention is directed to said method wherein the laser beam is incident at an angle to the surface such that the major evaporated plasma material from laser material interactions ejected along a smaller solid angle only and is sucked out through evacuation nozzle.

A still further aspect of the present invention is directed to said method comprising carrying out the said keyhole welding and conduction welding involving inclined laser beam with selective beam inclination for achieving desired penetration with good surface finish wherein for said keyhole welding the angle of inclination of the beam from the vertical is in the range of 15° to 45° preferably 30° to vertical and for conduction welding the beam inclination from the vertical is in the range of 30° to 60° preferably 45° to vertical.

In the above method of the present invention wherein carrying out the keyhole welding joints comprising welding by a laser beam striking inclined/normal to the surface being welded by a special welding nozzle with three concentric openings wherein gas is purged from the innermost and outermost openings while evaporated materials from Laser-material interaction is sucked out by the middle opening adapted as an evacuation chamber.

A still further aspect of the present invention is directed to said method comprising cleaning the weld region and surroundings involving short pulses of nano-second duration preferably laser pulses of low energy preferably in the region of 1-100 nano seconds and energy density in the range of about 1-5)/cm². The important aspect in this case being the sucking out of evaporating material due to laser material interaction.

A further aspect of the present invention is directed to said method comprising the step of smoothening of surface of joints involving low intensity defocused pulse laser beam adapted to penetrate only up to the modulations on the surface.

Importantly also in said method, wherein the wall thickness of the material welded is more than 1 mm and the welding by laser welding from inside surface of the wall of cavity having depth of penetration of welding ranging from greater than half the thickness and full depth of the material being welded.

According to yet another aspect of the present invention is directed to a keyhole welding nozzle for use in laser welding of Niobium based superconducting radio frequency (SCRF) cavities and the like comprising:

three concentric tubular members defining a nozzle head at the front and a hollow cylindrical shaft in the center accommodating a lens assembly for welding and viewing of the weld region;

three concentric tubes like enclosure assembly having a central region enclosure accommodating a lens assembly and necessary optics to focus the laser beam for welding and for viewing the welding zone along with a provision for high velocity gas for purging;

the second enclosure after the central region is adapted to be wide enough for sucking out the evaporated material due to laser material interaction and the outermost third enclosure is adapted to purge high velocity gas to minimize spread of evaporated material;

the outermost and innermost tube enclosure of nozzle head provided for high velocity inert gas to flow out whereas the middle enclosure is adapted for sucking out the evaporated material due to laser material interaction.

A further aspect of the present invention is directed to a conduction welding nozzle system for use in laser welding of Niobium based superconducting radio frequency (SCRF) cavities and the like comprising:

nozzles meant for delivery of dual beam laser with lens assembly adapted such that the beams are inclined preferably about 45° with respect to the vertical and having means for sucking out the weld plume rising perpendicular to the surface through an enclosure adapted to be moved up and down telescopically.

A further aspect of the present invention is directed to a welding rig which is the type I welding rig such as for carrying out welding of elliptical type SC cavities and the like comprising:

a vacuum vessel with motor driven attachments for holding and manipulating the half cells, aligned to form dumbbells of SCRF cavity for welding of cavity joints;

nozzle alignment mechanism;

keyhole nozzle means and conduction welding nozzle system selectively disposed and adapted to sequentially carry out the keyhole and conduction welding from inside surface of the wall of the dumbbell within said cylindrical vacuum chamber.

The above welding rig comprising laser welding nozzle selectively disposed for carrying out said laser welding of cavity joints from inside surface of the wall of cavity for joints in RF field region and from outside the surface for joints in RF field free regions.

Also in said welding rig wherein said welding nozzles are adapted to carry out inclined welding along the line of the weld joint but in the plane of periphery to be welded in the first phase by keyhole welding and followed by second phase conduction welding from inside surface of the wall of the cavity.

Further the above welding rig wherein said welding nozzles are adapted to carry out key hole welding from outside surface for joints in the RF field free region for stiffening rings and some end group components.

A still further aspect of the present invention is directed to a welding rig which is the type II welding rig such as for carrying out welding of elliptical type SCRF cavities and the like comprising:

a vacuum vessel with different devices/attachments, to carry out laser welding of joints of Niobium components of SCRF cavity, specifically for the equator joints of SCRF cavity adapted to house a rig insert adapted to assemble together welded half cells forming the dumbbells;

encoders and means for precise positioning of the nozzles from outside;

means preferably boroscopes provided to inspect the surrounding regions after welding is over.

said rig insert comprising two circular flanges held together by three tie rods spaced at 120° adapted to assemble together welded half cells forming the dumbbells and facilitate laser welding such as of equator joints of Niobium components of SCRF cavity;

strain gauges assembled in this insert adapted to monitor the distortions online during welding.

The above welding rig wherein said different devices/attachments comprises of a vacuum vessel, a tie rod mechanism to hold dumbbells system, provision for evacuation of vessel and purging with inert gas and seals for the different protrusions in the vacuum environment;

said means for precise positioning of the nozzles from outside comprises of a hollow cylindrical shaft capable of rotating about it's own axis carrying laser heads and also enclosures which move up and down to collect evaporated material from laser material interaction, said rig also including a mechanism involving two motors, ball screws and encoders which remain outside vacuum environment and provide precision rotary and axial movement to nozzles which are read by the encoders, operatively connected pipelines in the rig adapted to take out evaporated material from the welding region to outside the vacuum vessel.

A still further aspect of the present invention is directed to a rig system for carrying out welding of elliptical type superconducting radio frequency cavity joints both in the RF field region and RF field free regions comprising:

a set of atleast two welding rigs comprising (i) a welding rig assembly adapted for welding of half cells to form dumbbells and end group components; (ii) a welding rig assembly adapted for carrying out welding of equator joints from inside surface of the wall of the SCRF cavity.

A further aspect of the present invention is directed to a system for carrying out welding of elliptical type SCRF cavity components wherein each of the said rigs comprise weld accessories including a nozzle assembly with optical fiber connection adapted to facilitate delivery of laser beam in the form of controlled pulses which is adapted to deliver high energy pulse for keyhole welding, means for low energy laser pulses for conduction welding, defocused low energy pulses for weld smoothening and cleaning by nano second duration laser pulses, means for viewing of butting edges and welding of joints intermittently, means to inspect defective region of cavity and rectify regions having problems, means for weld smoothening and cleaning with removal of evaporated plasma materials from laser material interaction and means for evacuating the vessel and purging it by helium or any other suitable inert gas.

A still further aspect of the present invention is directed to said system wherein in said welding rig assembly the optical fiber is provided to carry four types of pulses comprising (a) high energy pulses having variation in time domain for carrying out keyhole welding in the RF field region as well as RF field free region (b) low energy pulses for conduction welding (c) pulses of lower energy adapted to function as defocused beam and (d) applying low energy pulses of nano second duration to those areas of the cavity where some surface defects are seen for laser cleaning.

The present invention, its objects and advantages are described in greater details with reference to the accompanying non-limiting illustrative Figures.

BRIEF DESCRIPTION OF THE ACCOMPANYING FIGURES

Figure 1A:
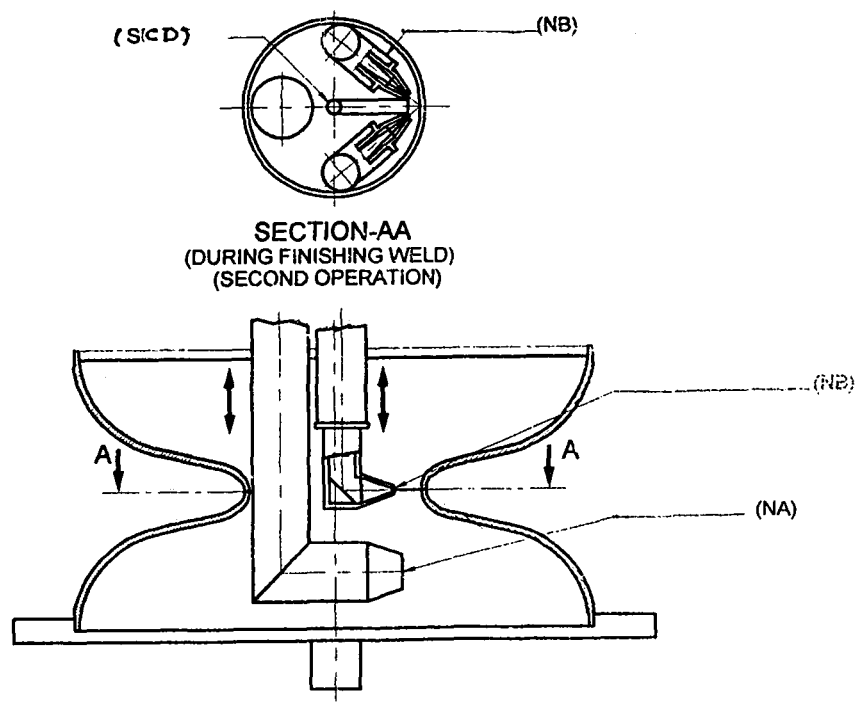
Figure 1B:
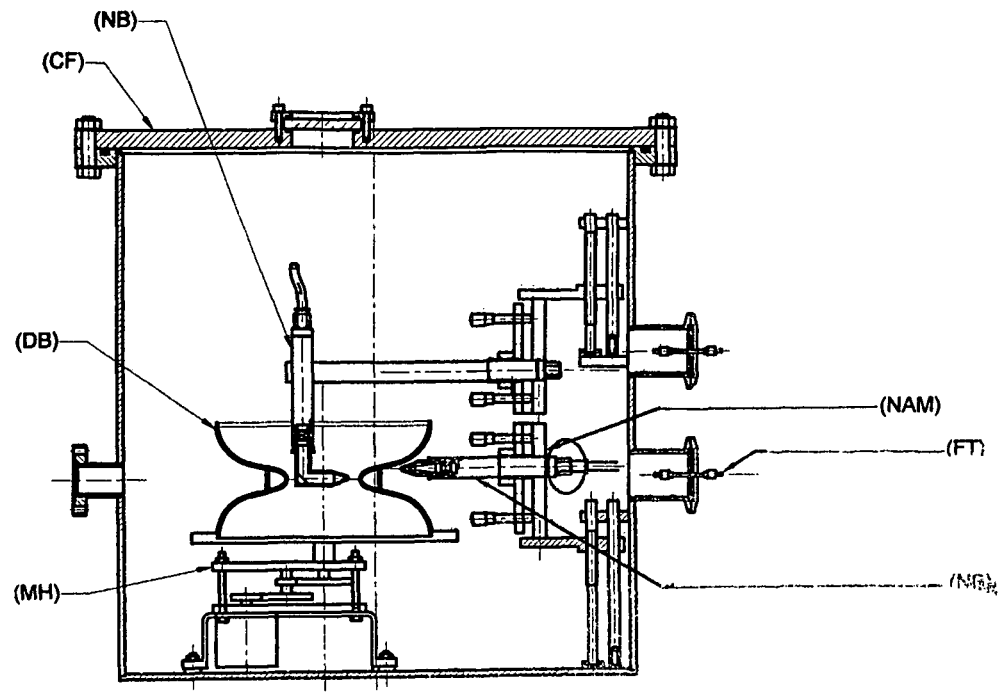
Figure 2:
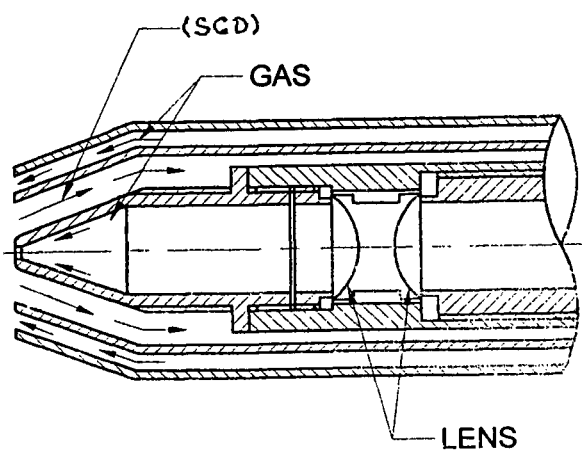
Figure 3:
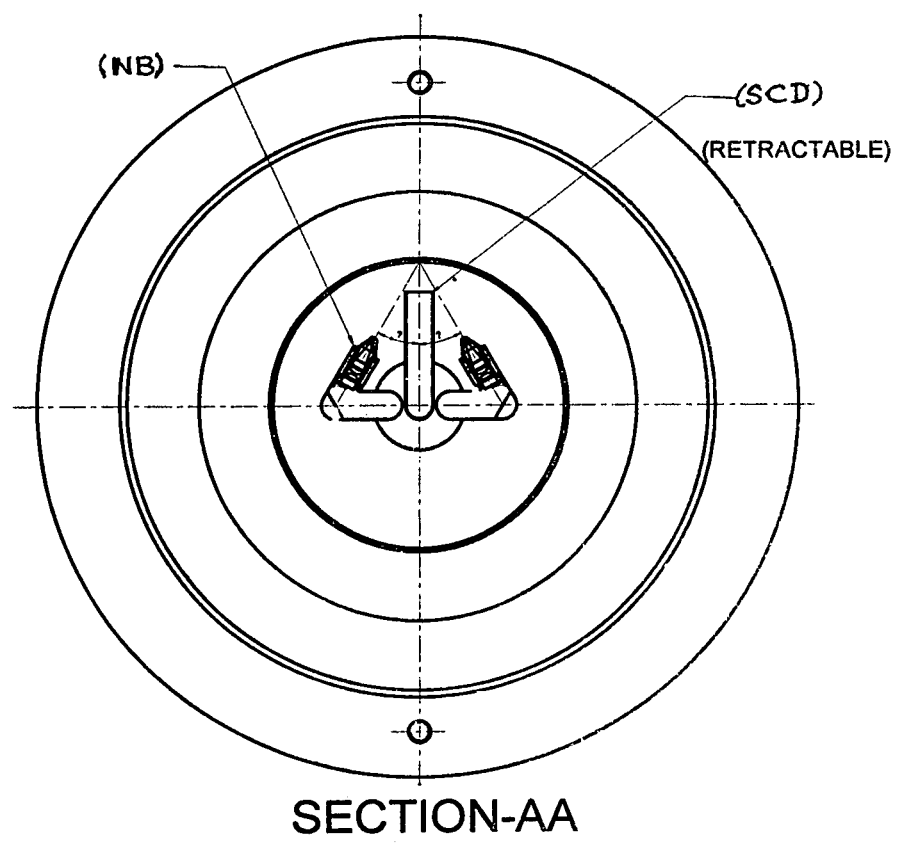
Figure 4A:
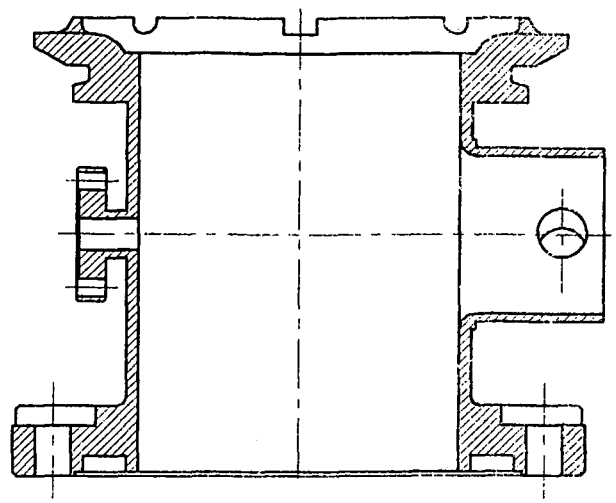
Figure 4B:
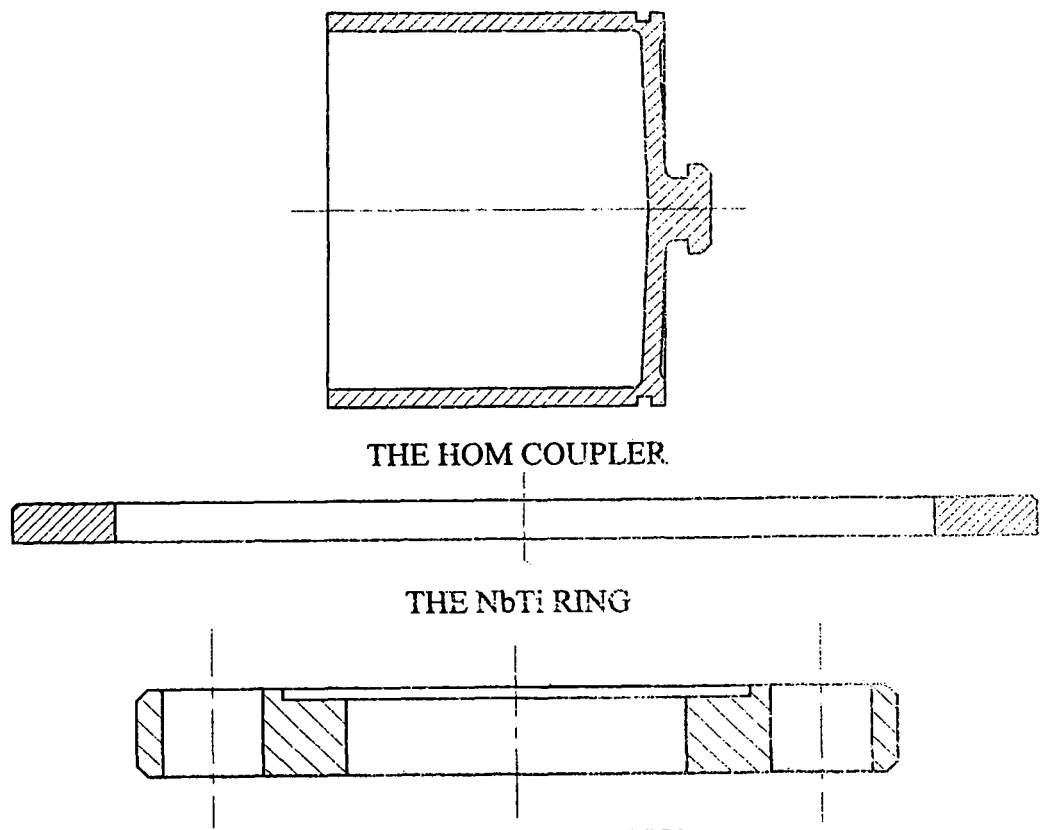

FIG. 1: is the schematic illustration of the Type I welding rig for carrying out laser welding of SCRF cavities in accordance with the present invention;

FIG. 1A: is an enlarged illustration of the arrangement of half cells forming the dumbbells housed in the Type I rig of FIG. 1 and a section AA of the same enlarged view in the dumbbell;

FIG. 1B: is the schematic illustration of the Type I welding rig for carrying out laser welding of stiffening ring on the dumbbell of SCRF cavities in accordance with the present invention;

FIG. 2: is the schematic illustration of the cross sectional view of an embodiment of the welding nozzle Type A in accordance with the invention;

FIG. 3: is the schematic illustration of the process of dual laser beam nozzle Type B based welding with provision for separate suction pipe for removal of evaporated plasma material FIG. 4a: shows the main body of an end group of an SCRF cavity;

FIG. 4b: illustrate the other components such as the HOM coupler, the NbTi ring and the coupler flange of an end group assembly.

Figure 4C:
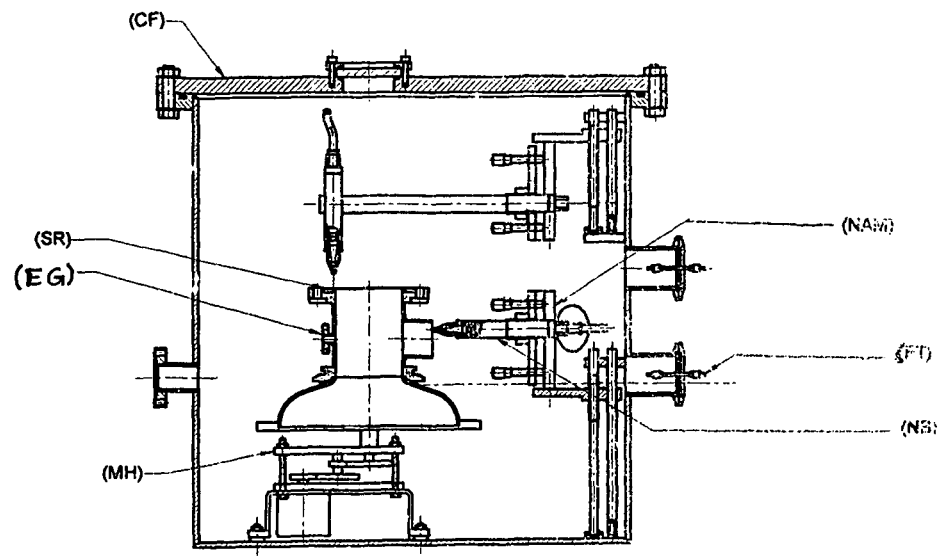
Figure 4D:
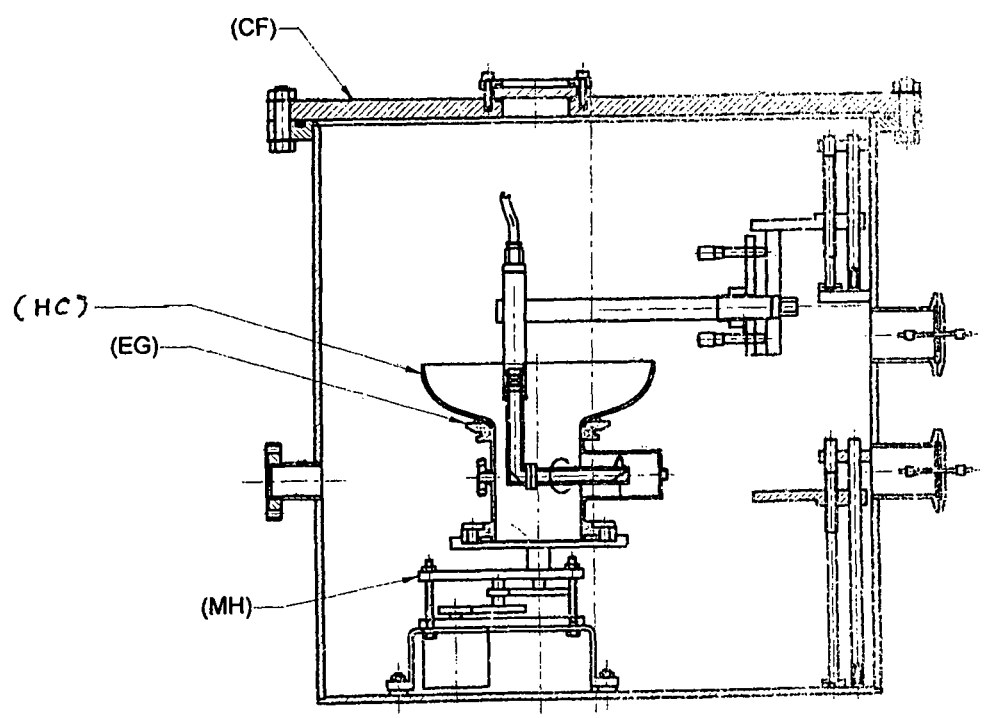
Figure 4E:
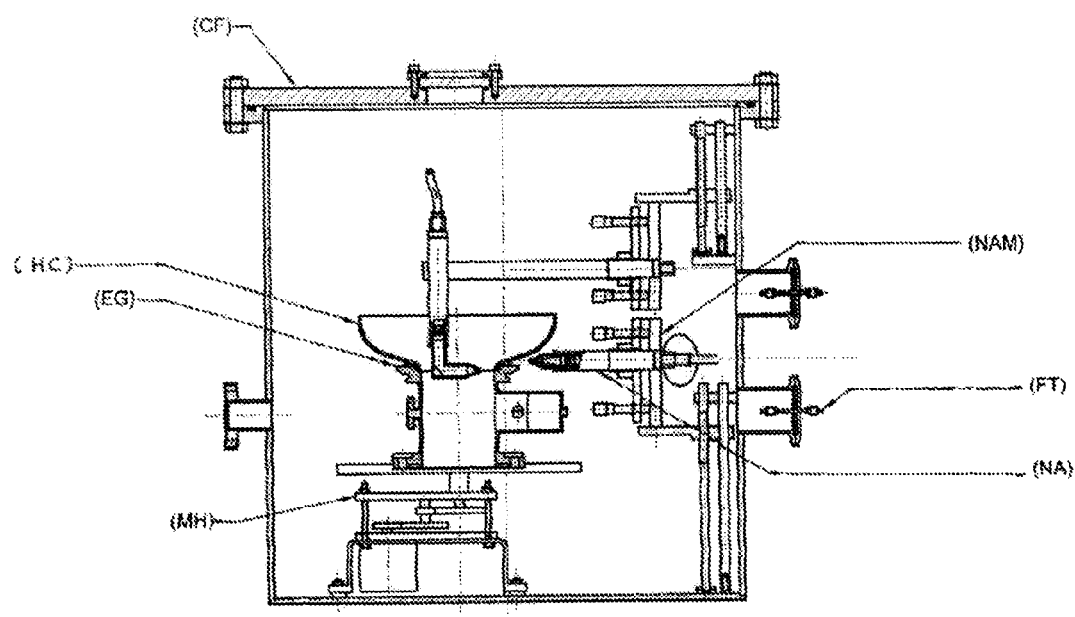
Figure 5:
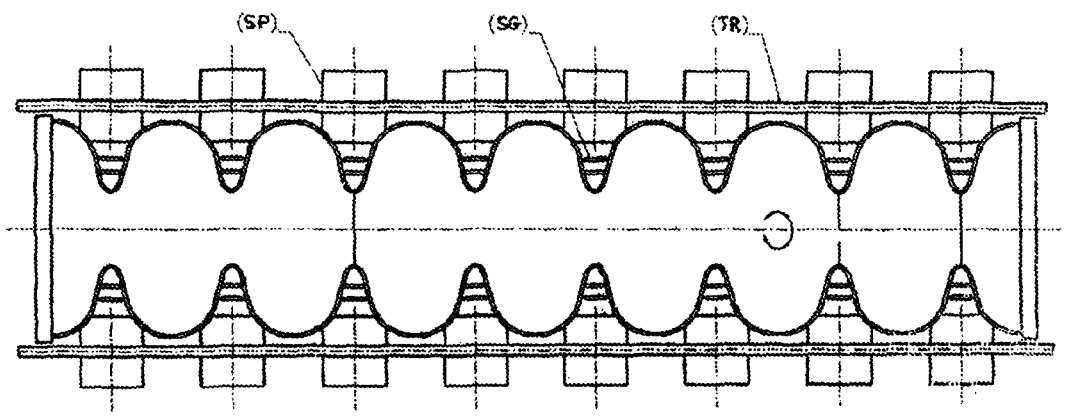
Figure 6:
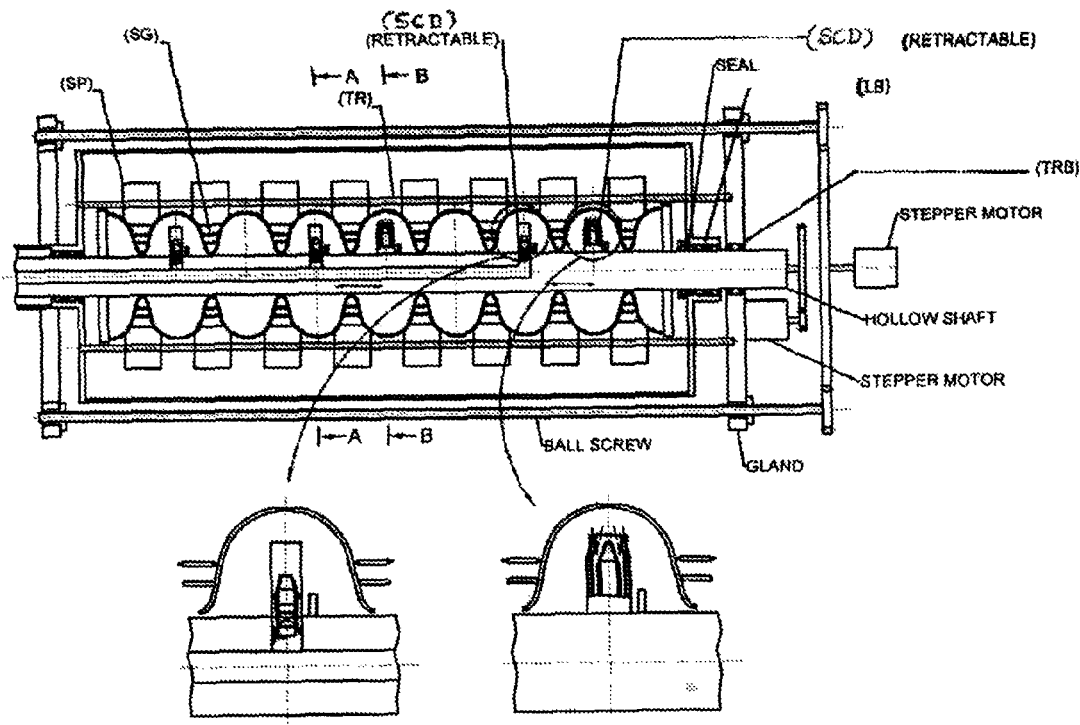
Figure 7:
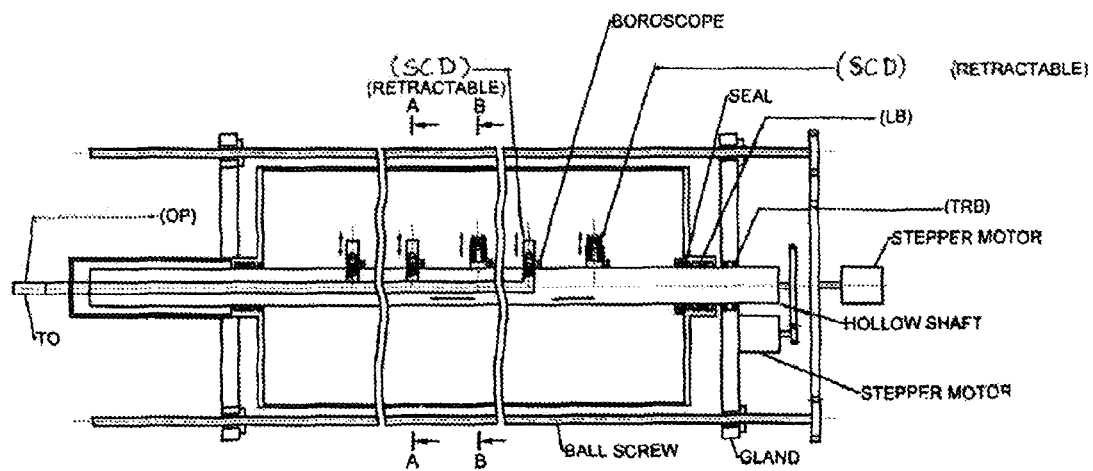
Figure 8:
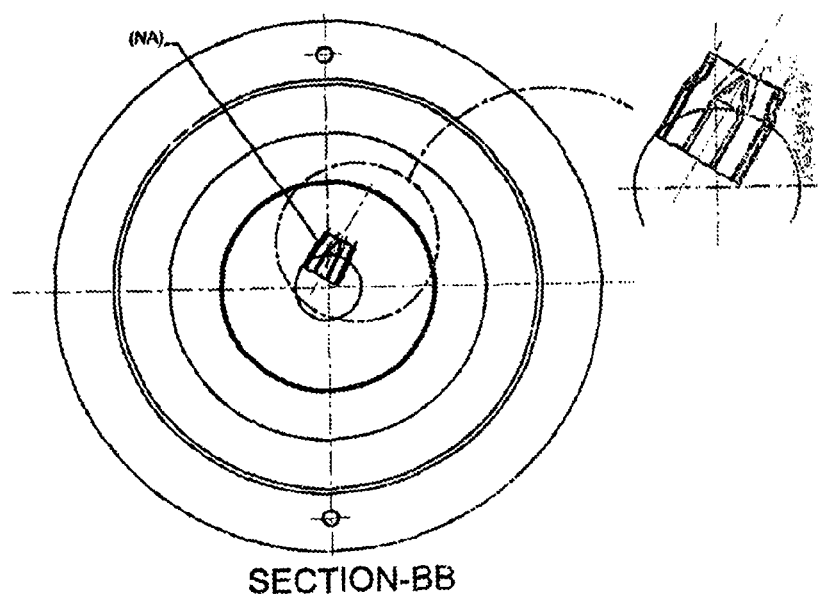
Figure 9:
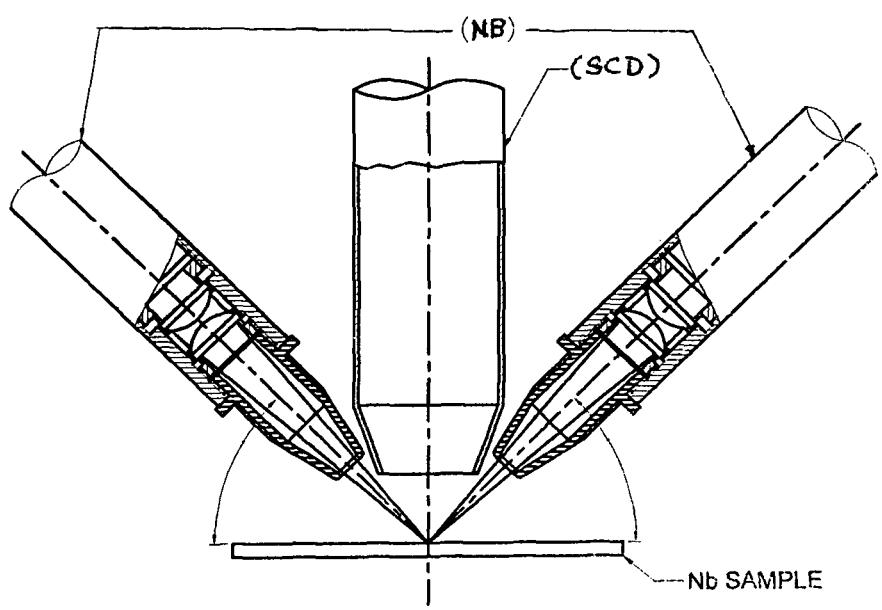
Figure 10:
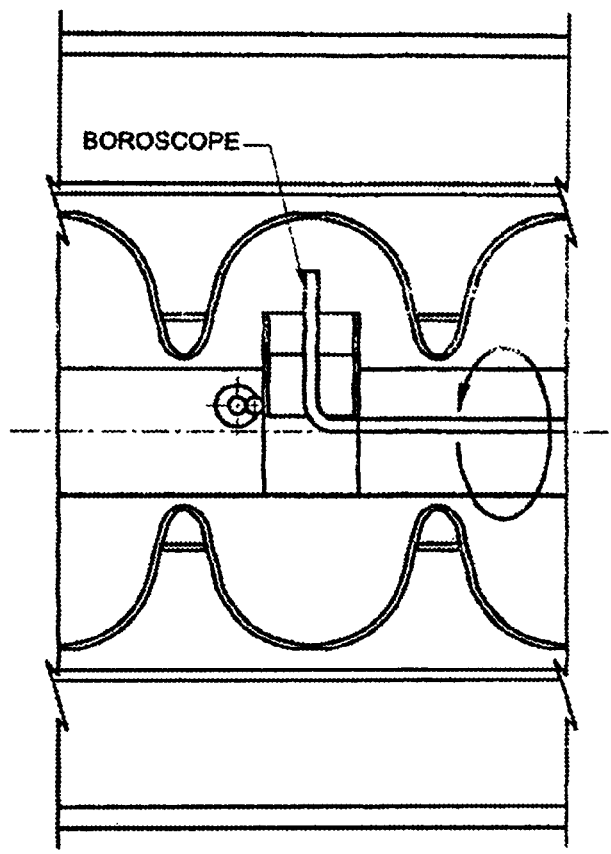
Figure 11:
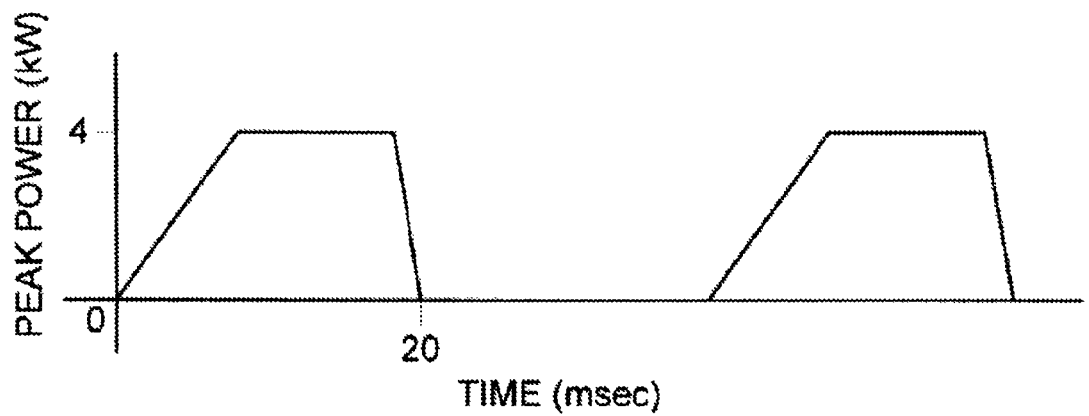

FIG. 4c: illustrates the set up for welding of the NbTi ring on flange inside Type I welding rig of the invention;

FIG. 4d: illustrates the set up for welding of HOM coupler in a Type I welding rig of the invention which shows keyhole welding and conduction welding/smoothening with only one beam through a nozzle which can rotate about it's own axis;

FIG. 4e: illustrates the set up for welding of half-cell on main body inside Type I welding rig of the invention;

FIG. 5: is the schematic illustration of the insert assembly required to carry out the welding in a Type II welding rig in accordance with the present invention;

FIG. 6: is the schematic illustration of the welding rig of Type II along with insert carrying the dumbbells for, welding, placed inside, according to the present invention;

FIG. 7: is the schematic illustration of Type II weld Rig without the insert assembly to show the detailed arrangements used in said welding rig involving all accessories/attachments/drives for laser welding and carrying out other desired functions;

FIG. 8: is the schematic illustration of the enlarged sectional view on B-B (as marked in FIG. 7) of the keyhole welding process carried out using welding nozzle of Type A;

FIG. 9: is the schematic illustration of the enlarged sectional view on A-A (as marked in FIG. 7) showing the manner of the conduction welding operation, which is performed after keyhole welding is over, using Type B welding nozzle;

FIG. 10: is the schematic illustration showing the set up for on-line boroscopic examination/inspection of the weld zone in a Type II welding rig;

FIG. 11: is the illustration of a typical near trapezoidal pulse shape configuration used for carrying out the pulsed laser welding in accordance with the invention.

DETAILED DESCRIPTION OF THE INVENTION WITH REFERENCE TO THE ACCOMPANYING FIGURES

Reference is first invited to accompanying FIG. 1 which is a schematic illustration of the welding rig of Type 1 having a simple cylindrical vacuum chamber with motor driven attachments for holding the dumbbells to weld such as the iris joints to form dumbbells and stiffening rings on the dumbbells of SCRF cavity.

As clearly illustrated in said figure, the Type I rig basically involves the cylindrical vacuum chamber which accommodates a rotary mechanism for supporting a pair of half cells forming the dumbbell and adapted for rotary motion for facilitating the welding. For the purpose of effecting the welding from inside surface of the wall of the cavity in the RF field region, a nozzle is provided. Another set of welding nozzles is also provided for welding other parts of end group. All nozzles are provided with precise alignment mechanisms.

Importantly, the Type I rig is adapted to carry out the welding from inside surface of the wall of the half-cell within the RF field region. There is a separate nozzle means (NA) to weld the components of end group main body with end group components. For the purpose of carrying out the welding from inside surface of the wall of half cells in the RF field region such as the iris joint with depth of penetration of welding ranging from greater than half the thickness to full depth of the material being welded, the Type I rig provides nozzles for keyhole welding and also conduction welding. Such an arrangement of selective provision for both a keyhole welding nozzle and conduction welding nozzles is shown in the following FIG. 1. FIG. 1A: is an enlarged illustration of the arrangement of half cells, forming the dumbbells housed in the Type I rig of FIG. 1 and a section AA of the same enlarged view in the dumbbell;

Advantageously, the provision of such nozzle and nozzle maneuvering arrangements are provided such as to facilitate the laser welding from inside surface of the wall of the half cell in the RF field region involving selectively (i) in the first phase carrying out keyhole welding with a laser beam inclined at an angle to the vertical in the plane of welding, the energy being varied in time phase for better penetration and followed by (ii) in the second phase carrying out conduction welding involving dual beam in order to obtain a very smooth finish after keyhole-welding operation is over, the evaporated material from laser material interaction rising up perpendicular to the surface of the joint and being collected by an enclosure.

In keeping with another aspect of the invention the same thus provides for two varieties of nozzles the type A which is used for carrying out the keyhole welding and Type B which is used for carrying the conduction welding with dual beam provision.

Reference is now invited to accompanying FIG. 2 which shows by way of a schematic illustration of the cross sectional view of an embodiment of the welding nozzle Type A used for welding joints by keyhole welding technique following the present invention. Its different elements are adapted to carry out the combined tasks of laser welding, providing two gas jets and suction mechanism to remove the evaporated material from the weld joint location. The lens assembly remains stationary and the enclosures move up and down.

Reference is now invited to accompanying FIG. 3, which shows Type B welding nozzle used in the present invention. This operation is performed in order to obtain a very smooth finish after keyhole-welding operation is over. Dual beam welding technique is used here. A major advantage here is that the evaporated material as a result of laser material interaction rises up perpendicular to the surface of the joint and is collected by an enclosure, which can be moved up and down. The lens assembly gives a focal length such that the two beams are focused on the butting edge.

FIG. 3 clearly illustrates the principle of dual beam welding with provision for removal of evaporated material. It shows welding nozzle of Type B, which aims to carry out laser welding of joints of Niobium components of SCRF cavity, for joints, which are in the RF field region. The welding is performed from inside surface of the wall of cavity with conduction welding technique after keyhole welding is over. The main feature is the enclosure for collecting the evaporated material, which can move up and down telescopically. A typical case of welding with the help of two beams, which make an angle of 45° with the vertical, has been illustrated.

Thus the arrangement of the said keyhole and conduction welding nozzles are such as to favor providing inclined laser beam with selective beam inclination for achieving desired penetration with smooth bead wherein for said keyhole welding the angle of inclination of the beam is in the range of 15° to 45° preferably 30° to vertical and for conduction welding the dual beams are inclined to vertical in the range of 30° to 60° preferably 45°. It is pertinent to point out that even for keyhole welding operation an inclination is being given so that the resulting weld bead, is smooth. Had the beam been incident at 90° to the surface although the penetration would have been higher the bead would have been poor and then mending it in the conduction welding phase would have been difficult.

Reference is now invited to accompanying FIG. 4a, which shows the main body of an end group used in an SCRF cavity involving laser welding in accordance with the present invention.

FIGS. 4c, 4d and 4e show the possible welding of NbTi ring on flange, the welding of the HOM coupler and also the welding of the half cell on main body all of which can be carried out using the welding rig Type I shown in FIG. 1. Importantly, the same provision for simple cylindrical vacuum chamber with motor driven attachments for supporting cavity components on a rotary platform adapted for rotary motion for facilitating the welding is shown. Welding nozzle arrangement for effecting the welding from inside surface of the wall of the end group component joints, which are in the RF field region is provided. For welding end group component joints in RF field free region, nozzle arrangement from outside is provided.

Reference is now invited to accompanying FIG. 5, which shows schematic illustration, of the insert of welding rig of type II according to the present invention. As shown in said figure this is an insert comprising two circular flanges held together by three tie rods spaced at about 120°, to carry out laser welding of equator joints of Niobium components of SCRF cavity. The half-cells, which were welded to make a dumbbell in type I welding rig are precisely assembled in this insert. The precisely shaped spacers are used for exact location. Strain gauges are also assembled in this insert to monitor the distortions online during welding. FIG. 6 is the schematic illustration of the welding rig of type II along with insert carrying the dumbbells for welding. According to the present invention this rig comprises of a vacuum vessel with different devices/attachments, to carry out laser welding of joints of Niobium components of SCRF cavity, specifically for the equator joints of SCRF cavity.

The insert, illustrated in FIG. 5 is first installed in the chamber and then welding takes place. The welding methodology comprises of the sequence, viewing butting edges—keyhole welding—viewing—repairing—viewing—dual beam conduction welding/smoothening—viewing the entire region with boroscope—laser cleaning—final smoothening with defocused laser—final inspection with boroscope.

In this rig the welding operation is performed in two steps. In the first step the keyhole welding process with the help of a beam, which is inclined at an angle to the vertical in the plane of welding is carried out. The energy is varied in time phase in this case for better penetration. Here the lens assembly does not move and it remains within the hollow cylindrical shaft. The three concentric tube type enclosures move up and down. The outermost and innermost tube enclosures are used for high velocity inert gas to flow out whereas the middle enclosure is used for sucking out the evaporated material due to laser material interaction.

In the second stage conduction welding operation is performed in order to obtain a very smooth finish after keyhole-welding operation is over. Dual beam welding technique is used here. A major advantage here is that the evaporated material as a result of laser material interaction rises up perpendicular to the surface of the joint and is collected by an enclosure, which can be moved up and down FIG. 7 is an illustration of the mechanism, which will be used in Type II welding rig. It illustrates some important features of this rig. Importantly, the system is adapted to provide for operative gadgets in a limited space available inside the cavity, for different welding contraptions like nozzles and optical fibers. The welding rig uses encoders, ball screws and other accessories so that precise position of the nozzles can be known from outside. A very significant aspect of this rig is the use of a ball screw and a cylindrical pipe in conjunction with each other so that precision of the ball screw can be utilized without the ball screw having to be inserted in the limited space inside the cavity. Boroscopes are provided to inspect the surrounding regions after welding is over.

FIG. 8 is the view of the keyhole welding process, which is taking place with the help of welding nozzle of Type A. Here the lens assembly does not move and it remains within the hollow cylindrical shaft. The three concentric tube type enclosures move up and down. The outermost and innermost ring enclosures are used for high velocity inert gas to flow out whereas the middle enclosure is used for sucking out the evaporated material due to laser material interaction. The nozzle is inclined in the plane of welding as is evident from the figure.

FIG. 9 is the view of the conduction welding operation, which is performed after keyhole welding is over. This process uses Type B welding nozzle. This operation is performed in order to obtain a very smooth finish after keyhole-welding operation is over. Dual beam welding technique is used here. A major advantage here is that the evaporated material as a result of laser material interaction rises up perpendicular to the surface of the joint and is collected by an enclosure, which can be moved up and down. The lens assembly gives a focal length such that the two beams are focused on the butting edge.

As discussed in relation to FIG. 3, the same principle of dual beam welding with provision for removal of evaporated material is followed. It involves welding nozzle of Type B, arranged in welding rig of type II according to the present invention, which aims to carry out laser welding of joints of Niobium components of SCRF cavity, which are in the RF field region. The welding is performed from inside surface of the wall of the cavity with conduction welding technique after keyhole welding is over. The main feature is the enclosure for collecting the evaporated material, which can move up and down telescopically. A typical case of welding with the help of two beams, which make an angle of 45° with the vertical has been illustrated.

FIG. 10 shows the provision for boroscpic examination of the surrounding region of weld, which is also provided in the type II weld rig of the invention.

FIG. 11: illustrates a typical pulse shape configuration (near trapezoidal) according to the invention to carry out the pulsed laser beam welding in the RF field region as well as RF field free region by performing keyhole welding with varying the pulse energy in time and space domain, adapted to achieve very good penetration with minimum HAZ along with low distortion and shrinkage.

Importantly, it is thus possible employing the above selective manner of manufacture of SCRF cavities to achieve for the first time Niobium or it's alloys based superconducting radio frequency (SCRF) cavities, comprising of at least one component made of Niobium or it's alloys which are joined by laser welding from inside surface of the wall of the cavity with depth of penetration of welding ranging from greater than half the thickness to full depth of the material being welded.

The full penetration weld (keyhole welding) could be obtained from inside surface of the wall of cavity with the provision of the Type A nozzle, which comprises three concentric tubes. The laser beam travels through the innermost tube. The outermost ring supplies gas at high velocity and the middle tube is connected to suction device. The welding parameters are such that pulse profile is varied in time phase to minimize energy deposited for same penetration depth thereby reducing distortion. The welding nozzle is inclined at an angle of 30-45° from vertical. The preferred angle is 30° to get a high penetration depth with good weld surface finish.

In the second step the inclined conduction weld nozzles are brought at the joint. Here the beams are inclined at 45° and the weld plume rises perpendicular to the surface. The evaporated material formed because of laser material interaction is sucked out through a separate evacuation enclosure adapted to move up and down in relation to the weld joint. Advantageously also following such operation a much more smooth bead could be obtained in this step.

It is important to note that in comparison to welding from two sides involving joints in the RF field region, weld to achieve a weld depth of more than half the thickness to up to full depth, the possible welding to such depth from inside surface of the wall of the RF field region achieved by the present invention following the combination of keyhole welding followed by conduction welding for the first time attains additional advantages as discussed hereunder:

A. Lesser number of weld settings, thereby saving time and money.
B. When welding in a single setting it is possible to avoid the problems, which are encountered during handling. A half welded cavity when removed from a rig and the fitted in the next rig may deform or get contaminated while handling.
C. Reinstalling the cavity in rig means that there is a risk of setting it up at a different position.

Lastly there always remains a risk whether the two fusion zones have met or is there a region which is unwelded and in such case whether it is conduction welding followed by keyhole welding or otherwise, problem with weld quality is expected. If the conduction weld is carried out firstly from inside surface of the wall of the cavity and the keyhole weld after this from outside then it may be that there is more than required penetration and spoiling of the surface finish and if it is the other way round then the risk of having an unwelded region is high as we don't get very good penetration depth with conduction welding which is aimed at getting a good surface finish.

Advantageously, it would be further apparent from the details of the system and method of the invention that the same also provides means for weld cleaning process by low energy pulsed laser of nano second duration wherein the evaporated plasma materials from laser material interaction are removed by sucking from weld zone using vacuum pumps of appropriate suction head. A flexible nozzle with multiple concentric circular passage section having optical fibre at center with suitably designed optics for carrying laser pulse for welding as well as purging inert gas at high velocity for protection of weld pool and driving plumes in vertically upward direction so that an integral or independent suction means deployed to suck the evaporated plasma materials from laser base material/metal interaction from weld zone. For keyhole welding with single nozzle is either in vertical orientation or low inclination with vertical and for conduction welding, dual nozzle with inclined orientation to vertical is used to perform weld surface finishing as well as favor suction of evaporated plasma materials from the laser material interaction. Importantly, the boroscope means with retraction facility favor carrying out pre and post-weld on-line inspection for fit up and defect free weld joint providing facility for optical inspection of the fit-up and weld finish/cleaning operations.

The system according to the present invention is further directed to carry out the laser welding of the SCRF cavity at different weld locations of the cavity by using controlled pulse parameters of pulsed laser welding such as the selective pulse shape in time domain, pulse repetition, pulse duration and pulse overlap in space domain depending on if the welding is in RF field and outside the RF field region vis-à-vis the requirement of pulse energy input to meet desired requirements of weld finish, reduced distortion/warpage of cavity, defect free weld with smooth surface finish for avoiding emission prone sharp points of weld joints and strength needed during service for charged particle acceleration.

Importantly also, to overcome the limitations in application of laser welding of components made of Niobium or its alloys of thickness of more than 1 mm or higher in the field of fabrication of SCRF cavity especially from inside surface of the wall of the cavity, preferably using any Solid State laser such as Nd:YAG laser, Yb:YAG laser, Fiber laser, or any other laser that can be delivered through optical fiber the present invention ensures superior weld quality adequate for application in SC cavities by incorporating new and inventive technical features comprising (a) Adopting a combination of keyhole welding and conduction welding for the joints in RF field region from inside surface of the wall of the cavity and other selective weld locations to perform more than half the thickness to full penetration weld joints for Niobium sheets/components having thickness over 1 mm and typically up to 3 mm by using high energy pulsed laser welding with controlled energy input to minimize distortion/shrinkage and confine to narrow HAZ, using said weld system/rig, nozzle, sequence and selective pulse characteristics/parameters; and conduction welding for bead smoothening using dual laser beam with nozzles symmetrically inclined to normal along plane of weld, carrying low energy pulsed laser beams and merging simultaneously on weld joint;

b) Selectively designing pulse parameters comprising the pulse shaping using preferably a near trapezoidal configuration having favorable characteristics, pulse duration, frequency of pulse repetitions, pulse overlapping to match the weld joint characteristic required to comply with particular application;

c) The possibility of occurrences of surface roughness/ weld ripples on bead surface is smoothened by a defocused laser beam of millisecond duration and laser cleaning of inner surface by low energy pulse of nano second duration; removing the evaporated material due to laser material interaction in both cases.

d) To suck out evaporative plasma materials from the laser material interaction, involving specially designed nozzle having evacuation enclosure connected to vacuum pump means to create desired volumetric capacity and vacuum head required for such cleaning and thus minimizing possibilities of surface defects that may lead to defects like field emission while in service;

e) Smooth weld bead is ensured for reliable performance of the SCRF cavity minimizing the requirement of heavy chemical processing minimizing associated problems of time taking, hazardous and costly process.

f) Using specially configured weld rigs and contraptions for each type and location of weld joints in the multicell SC cavities requiring meeting specific quality criteria based on service/end application, adapted for faster/automated process and equipments with reliable weld quality to suit industry scale application in a simple and user friendly manner.

The system of laser welding for Niobium welding for fabrication of SCRF cavities according to the present invention and the manner of implementation of the laser welding from inside surface of the wall of the cavity using the welding rigs of two categories e.g. Type I, & II as discussed above for different weld locations in the fabrication of the SCRF cavity are described in further details with reference to specific embodiments and drawings in following broad categories:

1) Welding of half cells to form dumbbells in Type I rig.
2) Welding of end group components on to the main body of end group in Type I rig.
3) Welding of Equator joints of SCRF cavity from inside surface of the wall of cavity and welding of end group with end half cell to the rest of cavity using the insert and weld rig of Type II;

BRIEF DESCRIPTION OF THE PROCESS

The Following Steps Illustrate how an Elliptical Type SCRF Cavity can be Fabricated Using this Present Invention
STEP-1: Welding Iris Joints from Inside Surface of the Wall of Half Cell in the Type I Welding Rig to Form Dumbbell from Two Half Cells Reference is now invited to the accompanying FIG. 1 which is schematic illustration of the laser beam welding of the pre-formed half cells from Nb based sheet material welded together to form dumbbells (DB) used to fabricate SCRF cavity using the Weld Rig of Type I (WR-I) having a simple cylindrical vacuum chamber with motorized attachments for holding (MH) and manipulating wherein welding of joints in RF field and field free region and in particular the set up for keyhole welding followed by dual laser beam conduction welding of iris joint (IJ) from inside surface of the wall of cavity has been shown. The accompanying FIG. 1 also shows an enlarged view of the dumbbell (DB) portion wherein the 'A' type nozzle (NA) is used for keyhole welding as first operation followed by dual laser beam for weld smoothening using conduction welding in sequence/succession as second stage of operation, have been shown. A sectional plan view on A-A of the dumbbell on the plane of iris joint (IJ) shows the selective inclination to vertical disposition of the dual nozzles of 'B' type (NB). These nozzles are having retractable mounting with respect to the rig to move up down as and when necessary to maintain desired sequence of weld operation and focusing with respect to a specified weld joint. It has been experimentally found that the optimized weld parameters include said keyhole welding carried out with the angle of inclination of the beam from the vertical in the range of 15° to 45° preferably 30° to vertical and for conduction welding the beam inclination from the vertical is in the range of 30° to 60°, preferably 45° to vertical for desired bead smoothening to obtain joints free of defects including avoiding sharp points on weld surface prone to field emission while in service. The weld rig is provided with nozzle alignment mechanism (NAM) with feed through (Fr) arrangement enabling precisely focusing the laser beam on the joint to be welded. The job is held by means of a motorized holder (MH) that receives rotary motion to carryout the circumferential weld seam at desired speed of rotation to match desired welding speed. At the first stage of keyhole welding of iris joint in Type I rig, the 'A' type nozzle used is having inbuilt concentric cylindrical passage/tubes (CR) for evacuation of the evaporating plasma materials from the weld site. For type B nozzle an evaporated plasma material suction device (SCD) is located perpendicular to weld surface at central position between the two inclined laser beams adapted to sucking in and disposing off the plumes that is directed in central vertically upward direction by the two laser beams at inclined orientation to vertical from two sides of the welding site.

The vessel is now closed and evacuated to a vacuum of $10^{-5}$ mbar. Suitable ultra pure inert gas-either of helium, or argon is then purged in this vessel to displace the air trapped inside. After a couple of such cycles, it can be reasonably ensured that no contaminating gas is present in the chamber.

The vacuum vessel (VV) is in complete inert atmosphere with the job mounted on motorized positioner/holder inside the vessel. The joint is then checked for proper fit up visually from both inside and outside. The holding cum manipulating mechanism is used to ensure that the beam focal point is perfectly matched with butting line of two half-cells. As the next step a He—Ne laser is then used to check the focal point of the impending beam.

The iris joint which is located in the RF field region, is welded by keyhole welding technique using laser welding nozzle type 'A' (NA), in near vertical or slightly inclined to vertical orientation. The joint is viewed with the help of a viewing mechanism that uses the same lens mechanism, which was used to weld the joint. If there is some region, which is unwelded, then it is welded again without opening the chamber. Appropriate pulse energy is used to achieve full depth of penetration typically up to 3 mm thickness of Nb or Nb alloyed components used.

The full penetration weld (keyhole welding) is obtained from inside surface of the wall of the cavity with the help of a Type 'A' nozzle (NA), which has three concentric tubes. The laser beam travels through the innermost tube. The outermost and innermost tube enclosures are used for supplying high velocity inert gas to flow out to the weld region and the middle tube/enclosure is used for sucking out the evaporated material due to laser material interaction. The welding parameters are such that pulse profile is varied in time phase to minimize energy deposited for same penetration depth thereby reducing distortion. The welding nozzle is inclined at an angle of 15°-45° and more preferably 30° to vertical to achieve good surface finish for same depth of penetration.

In the second step the inclined nozzles (NB) are brought at the welded joint. The beams are inclined and the weld plume rises perpendicular to the surface. The evaporated material formed because of laser material interaction is sucked out through an evacuation enclosure/suction device (SCD), which is seen in the plan view only. Similarly, the two nozzles (NB) are visible in the top view only. In this operation a very smooth bead is obtained.

As a next step, said inside surface of the wall of welded joint is viewed with the help of a viewing mechanism that uses the same lens mechanism, which will be used to weld the joint. The surroundings are viewed with the help of a boroscope. In case there is a requirement then the weld is repaired/re welded by suitable nozzle NA or NB with sucking out of evaporated material as has been done throughout the process. If the need be then a low energy defocused beam is used to smoothen the undulations on the surface of weld bead after laser cleaning. FIG. 1A depicts an enlarged illustration of the arrangement of half cells forming the dumbbells housed in the Type I rig of FIG. 1 and a section AA of the same enlarged view in the dumbbell;

A separate optics (OP) is provided at a suitable location on the top cover flange (CF) of the vacuum vessel (W) for viewing the fit up and process from outside the chamber. FIG. 1 shows only one of these two beams in front view. The joint once made is viewed to see if there is some area left unwelded, repair is performed at the same place in the next pass. A retractable mechanism provided on a central shaft at the axial location allow approach of the vertical single nozzle (NA) and the paired inclined nozzles (NB), one after the other in sequence, to access the weld area, movements of which can be controlled from outside of the rig.

The chamber is then opened and stiffening rings (SR) over the iris joints of the SCRF cavity are fitted with suitable fixtures. The vessel is now closed and evacuated to a vacuum of $10^{-5}$ mbar. Suitable ultra pure inert gas-either of helium, or argon is then purged in this vessel to displace the air trapped inside. After a couple of such cycles, it can be reasonably ensured that no contaminating gas is present in the chamber. The stiffening ring (SR) joint, which is in the RF field free region, is welded by keyhole welding technique. The joint is viewed with the help of a viewing mechanism that uses the same lens mechanism, which was used to weld the joint. If there is some region, which is unwelded, then, it is welded again without opening the chamber.

The dumbbell (DB) assembly is left for some time to come to ambient temperature. As the pulsed energy input is selectively controlled, there is no significant rise in temperature and hence distortion and shrinkage is controlled. The gas, which is being provided, also helps in cooling. The dumbbell (DB) assembly is taken out and thoroughly inspected for any region, which has less smoothness in bead and/or some region, which has certain areas, which need to be cleaned. The dumbbell is again fitted inside the chamber and manipulating mechanism is used to defocus the beam. The vessel is now closed and evacuated to a vacuum of $10^{-5}$ mbar. Suitable ultra pure inert gas-either of helium, or argon is then purged in this vessel to displace the air trapped inside. After a couple of such cycles, it can be reasonably ensured that no contaminating gas is present in the chamber. The cleaning of the weld region is performed with very short pulses of low energy and then smoothening of the bead is performed with defocused low energy pulses.

Reference is now invited to the accompanying FIG. 1 that illustrates the schematic arrangement of the welding rig of Type I having a simple cylindrical vacuum chamber with motorized holder (MH)/attachments for holding and rotating the dumbbells (DB) by rotary mechanism for welding of stiffening rings from outside fitted on the dumbbells circumferentially covering the iris joint of SCRF cavity by suitably locating and focusing the laser beam using the weld nozzle of type 'A' at the exact weld location by means of nozzle alignment mechanism (NAM) and feed through (FT). The entire assembly and the welding can be viewed from out side through a suitable optics (OP) on the top cover flange (CF) fixed on the vacuum vessel (VV) which is demountable. The accompanying FIG. 1B also shows the laser welding nozzle position for single/dual laser beam welding of Iris joint from inside surface of the wall of the cavity dumbbell, as already described.

STEP-2: Fabricating the End Group by Welding the Joints by Laser Welding Inside the Type I Welding Rig.

The main body (MB) of the end group (EG) is first provided as shown in FIG. 4a. This is obtained by machining it out of a single block of niobium. Wire cut EDM process is used to remove a cylindrical block of niobium and this block is used to make HOM coupler and other flanges to be used with end group. Machining process performed on a turn mill centre make the other features of the end group main body.

The end group (EG) joints are usually welded using Type I welding rig.

Reference is now invited to the accompanying FIG. 4c that shows how to weld the end group components one by one. The basic methodology is same as illustrated in Step 1. The fixtures and set-up will only differ. The same Type I rig is used to carry out all such welding of the end group components.

Reference is also invited to the accompanying FIG. 4b, which shows the other components of end group comprising the HOM coupler, the NbTi ring and the coupler flange used in end group assembly/fabrication.

Reference is now invited to the accompanying FIG. 4c, which shows welding of NbTi ring to the end group flange. It is clearly apparent from the accompanying FIG. 4(b) that the nozzle is vertically positioned on the weld location for welding the NbTi ring fitted at top of the end group body such that complete penetration is achieved by keyhole welding from outside.

Reference is now invited to the accompanying FIG. 4d, which shows welding of HOM coupler flange to main body of end group. Here, keyhole welding and conduction welding/smoothening is achieved with only one beam through a nozzle which can rotate about it's own axis.

Reference is now invited to the accompanying FIG. 4e, which shows welding of half-cell to main body of end group. It is the welding in RF field region taking place from inside surface of the wall of the SCRF cavity. Care is taken to avoid any surface irregularity due to welding at this location and accordingly the weld parameters are selectively used while ensuring full penetration weld. A finish welding using dual laser beam from inside surface of the wall of this joint serves the purpose of meeting the requirement of RF field region joint.

Methodology for Welding End Group Components

The components are assembled with the main body with the help of fixtures one by one. The joints will be made in different settings. The joint is then checked for proper fit up visually from both inside and outside. The manipulating mechanism is used to ensure that the beam focal point is perfectly matched with butting line. As the next step a He—Ne laser is then used to check the focal point of the impending beam from inside. Similarly He—Ne laser is then used to check the focal point of the impending beam/beams from outside for joints in RF field free region.

The vessel is now closed and evacuated to a vacuum of $10^{-5}$ mbar. Suitable ultra pure inert gas—either of helium, or argon is then purged in this vessel to displace the air trapped inside. After a couple of such cycles, it can be reasonably ensured that no contaminating gas is present in the chamber.

The joints, which are in the RF field free region, are welded by keyhole welding technique. The joint is viewed with the help of a viewing mechanism that uses the same lens mechanism, which was used to weld the joint. If there is some region, which is unwelded, then it is welded again, without opening the chamber.

The joints, which are in the RF field region, are first welded by keyhole welding technique followed by conduction welding technique. The joint is viewed with the help of a viewing mechanism that uses the same lens mechanism, which was used to weld the joint. If there is some region, which is unwelded, then it is welded again without opening the chamber. The cleaning of the weld region is performed with very short pulses of low energy followed by smoothening of the bead, which is performed with low energy pulses.

STEP-3: Welding Equator Joints with Help of Insert in the Type II Welding Rig, to Form Cavity with the Pre-Welded Dumbbell Assemblies.

Reference, is first invited to the accompanying FIG. 5 to FIG. 7 that illustrates laser welding of equator joint of cavity using Type II welding Rig and the Insert assembly for precise fit up and online distortion monitoring and control of such weld joint. Such a rig is designed to weld the joints of the SCRF cavity falling inside the RF field region. Such a rig essentially consists of a vacuum vessel made of stainless steel (SS 316L). The ends of the vessel are such that it can be opened from one side. There are a few windows on the lateral surface for viewing. The weld rig vessel has provision to be attached to a vacuum pump. The tube carrying the optical fiber also carries inert gas. This tube is introduced into the weld chamber with the help of feed through. The same optical fiber is used to couple four types of pulses in time-sharing basis. A very special feature of this welding rig is the online distortion monitoring by providing strain gauges (SG) between cells. The first part of this welding rig is an insert (IN) as illustrated in the accompanying FIG. 5, which is made by using two circular flanges (CFS) that are held together by three tie rods (TR) circumferentially spaced 120° apart. It is clearly apparent from FIG. 5, that the half-cells/dumbbells (DB) have been assembled together with precisely contoured spacers (SP). All the dumbbells made of half-cells are precisely machined at edges and assembled together, with strain gauges (SG) mounted in between two consecutive half cells/dumbbells (DB) to monitor and control distortion/shrinkage during welding. The half-cells, which were welded to make a dumbbell (DB) in Type I welding rig, are precisely assembled in this insert (IN). The precisely shaped spacers (SP) are used for exact location maintaining co-axiality of the dumbbells to form a complete cavity. Strain gauges (SG) are also assembled in this insert to monitor the distortions online during welding.

This whole assembly is then slid inside the vacuum vessel as shown in the accompanying FIG. 6. Now welding of equator joint completely from inside surface of the wall of cavity is taken up. First it is welded with a high energy pulse which has a particular variation of energy in time phase and then in the next step smoothening the weld bead with the help of a dual beam welding technique, as already illustrated with reference to welding of iris joints in type I Rig is done.

The accompanying FIG. 6 shows the schematic illustration of the welding rig of type II along with insert carrying the dumbbells for welding. According to the present invention this rig comprises of a vacuum vessel with different devices/attachments, to carry out laser welding of joints of Niobium components of SCRF cavity, specifically for the equator joints of SCRF cavity.

The welding methodology follows the sequence, viewing butting edges—keyhole welding—viewing—repairing—viewing—dual beam conduction welding/smoothening—viewing the entire region with boroscope—laser cleaning—final smoothening with defocused laser—final inspection with boroscope.

The welding operation is performed in two steps in this rig. In the first step, keyhole welding process is used with the help of a beam/nozzle which is inclined at an angle in the range of 15° to 45° and preferably 30° to the vertical in the plane of welding. The energy is varied in time phase in this case for better penetration. The welding nozzle used is Type 'A' having three concentric tube type annular passages to carry laser beam as well as the desired flow rate of protective gas and suction device to remove evaporated plasma material generated during welding. Here, the lens assembly does not move and it remains within the hollow cylindrical shaft. The three concentric tube type enclosures move up and down. The outermost and innermost tube enclosures are used for high velocity inert gas to flow out whereas the middle enclosure is used for sucking out the evaporated material due to laser material interaction.

The 'A' type nozzle that is used for keyhole welding is shown in FIG. 2, illustrating the detailed constructional features in a sectional view. The full penetration weld (keyhole welding) will be obtained from inside surface of the wall of cavity with the help of this nozzle as shown which has three concentric tubes/annular passages. The laser beam is delivered through the innermost tube. The outermost and innermost tube supplies gas at high velocity and the middle tubels connected to suction device. The nozzle has the flexibility to access remote weld locations. Its different elements are adapted to carry out the combined tasks of laser welding, providing two gas jets and suction mechanism to remove the metal vapors or other evaporated material from the weld joint location. The lens assembly remains stationary and the enclosures move up and down.

In the second stage conduction welding operation is performed in order to obtain a very smooth finish after keyhole welding operation is over. Dual beam welding technique is used for this. A major advantage of dual laser beam at inclination to vertical orientation from two sides to the weld spot is that the evaporated material generated due to laser material interaction rises up perpendicular to the surface of the joint and is easily collected by an enclosure which is adapted to move in up and down directions.

The equator welding is performed in the SS chamber shown in FIG. 5. The insert is assembled inside the chamber, joints are then checked for proper fit up visually from inside. The manipulating mechanism is used to ensure that the beam focal point is perfectly matched with half-cell butting line. As the next step a He—Ne laser is then used to check the focal point of the impending beam from outside. The chamber is now closed and is evacuated to a vacuum of $10^{-5}$ mbar. Suitable ultra pure inert gas-either of helium, or argon is then purged in this vessel to displace the air trapped inside. After a couple of such cycles, it can be reasonably ensured that no contaminating gas is present in the chamber.

The equator joints, which are in the RF field region, are welded by keyhole welding technique. The use of varying energy in time within a pulse and pulse overlap in space are used to generate low heat affected zone and full depth of penetration. The pulse to be used is depicted in FIG. 11. The welding parameters are such that pulse profile is varied in time phase to minimize distortion but still obtain full depth penetration. The temporal profile of the pulse is tailored for Niobium or its alloys preferably by varying, the energy within the pulse in time domain in a near trapezoidal shape such that initial preheating of surface results in higher penetration and the tapering off the energy near the end is done in such a way to avoid micro cracks/porosity/other defects, whereby the overall pulse shape ensures high penetration depth and low distortion.

The joint is viewed with the help of a viewing mechanism that uses the same lens mechanism, which was used to weld the joint. If there is some region left unwelded, then it is welded again without opening the chamber. The insert is taken out and spacers and strain gauges are uninstalled.

FIG. 7 Shows the mechanism, which is used in Type II welding rig. It illustrates some important features of this design. There is no ball screw which goes inside the welding chamber as we want to utilize the little space available inside (which is the case with most of the elliptical cavities), for different welding contraptions like nozzles and optical fibers. The welding rig uses encoders and other accessories so that precise position of the nozzles can be known from outside. Boroscopes (BS) are provided to inspect fit up of a joint prior to start of weld and also the weld joint and surrounding regions after welding is over for any possible defect requiring rectification.

The methodology will be same i.e. evacuation, purging with pure gas, welding with sucking out of evaporated material and the allowing the assembly to cool before it is taken out. Initial data from strain gauges is generated through a few trial runs for a few fit ups of dumbbells of SC cavities and a welding sequence is standardized.

A specially designed insert is used to hold the dumbbell assembly by three tie rods circumferentially spaced 120° apart. This whole assembly is then slid inside the vacuum vessel of Type II weld rig as shown in the accompanying FIG. 7.

All the joints are made in single setting. The joint is first viewed through optical fiber and lens mechanism to ensure that the beam focal point is perfectly matched with butting line for this task a He—Ne laser (or any suitable laser in visible spectrum) is used to check the focal point of the impending beam while viewing from outside. The vessel is now closed and evacuated to a vacuum of $10^{-5}$ Mbar. Suitable ultra pure inert gas—either helium, or argon is then purged in this vessel to displace the air trapped inside. After a couple of such cycles, it can be reasonably ensured that no contaminating gas is present in the chamber.

The equator joints, which are in the RF field region, are welded first by keyhole welding technique as illustrated in FIG. 8, in 'section B-B' of FIG. 7. Here the lens assembly does not move and it remains within the hollow cylindrical shaft. The three concentric tube type enclosures move up and down. The outermost and innermost concentric annular enclosures are used for high velocity inert gas to flow out whereas the middle enclosure is used for sucking out the evaporated material due to laser material interaction. The nozzle is inclined in the plane of welding as is evident from the figure. The preferred angle is 30° for keyhole welding using single laser beam.

The joint is viewed online with the help of a viewing mechanism that uses the same lens mechanism, which was used to weld the joint. If there is some region, which is left unwelded then it is welded again without opening the chamber.

The smoothening of the bead is performed in the second step with low energy pulses using two inclined laser beams delivered and directed by a separate set of nozzles. A retractable evaporating material suction arrangement has been provided with its open end close to the weld seam having means for collection through concentric enclosure. This is illustrated in the accompanying FIG. 9, as indicated in section 'A-A' of FIG. 6. This operation is performed in order to obtain a very smooth finish after keyhole-welding operation is over.

Dual beam welding technique is used here. A major advantage here is that the evaporated material as a result of laser material interaction rises up perpendicular to the surface of the joint and is collected by an enclosure, which can be moved up and down. The lens assembly has a focal length such that the two beams are focused on the butting edge.

Accompanying FIG. 3 shows the enlarged view of the deployment of two inclined nozzles to illustrate the principle of dual beam welding with removal of evaporated material. It shows the welding nozzle of Type B (NB), arranged in welding rig of type II (WR-II) according to the present invention. The nozzle set up aims to carry out laser welding of joints of Niobium components of SCRF cavity, which are in the RF field region. The welding is performed from Inside surface of the wall of cavity with conduction welding technique after keyhole welding is over. The main feature is the enclosure for collecting the evaporated material, which can move up and down telescopically. A typical case of welding with the help of two beams, which make an angle of 45° with the vertical has been illustrated.

In the next step, without opening the chamber, the boroscope fitted with the central shaft is used to view the entire weld region as well as the surroundings. The boroscopic inspection set-up and procedure has been schematically illustrated in the accompanying FIG. 10. In the last step the assemblage of dumbbells is now withdrawn from the vessel.

It is thus possible by way of the present invention to develop superconducting radio frequency cavity fabricated by laser welding of Niobium and its alloy based cavities such that said laser welding would enable achieving Niobium or it's alloys based superconducting radio frequency (SCRF) cavities, comprising of at least one component made of Niobium or it's alloys which are joined by laser welding from inside surface of the wall of the cavity with depth of penetration of welding ranging from greater than half the thickness to full depth of the material being welded. This in turn would facilitate the production of much required weld joints of the cavity with good surface finish, strength and mitigation of risks of field emission so that consistent performance from the RF joints can be obtained while in service for charged particle acceleration in these cavities. Importantly, the system, apparatus and method of the invention is specially configured to carry out the full depth of penetration of welding Nb or Nb alloyed components of thickness over 1 mm and typically 3 mm thickness or more from inside surface of the wall of the SCRF cavity using welding rigs of Type I and Type II and special nozzle configuration/orientations in two steps—firstly keyhole welding using high energy laser pulse and then in second step weld smoothening by low energy laser pulse with dual laser beam selectively directed inclined to vertical. Retractable concentric tubular evacuation arrangement is provided to suck away the evaporated materials from the laser material interaction, while the lens and focusing means is housed inside the hollow axial central core of shaft/cable of the Type II rig. Also laser weld is carried out precisely at different weld locations for various components of the SCRF cavity both in RF field region and RF field free region with minimum human intervention, minimum distortion/rejection, superior and consistent weld quality with narrow HAZ, low distortion and shrinkage, high strength, weld surface free of any sharp point and faster production of such cavities, thus enabling fabrication of such SCRF cavity of superior quality and reliable performance for accelerating charged particles without the risks of any filed emission during operation of the cavity.

We claim:
1. A method of producing Niobium based superconducting radio frequency (SCRF) cavities having wall thickness over 1 mm to up to 3 mm and including laser welded component joints in RF field region of said cavity obtained of Niobium sheets/components having thickness over 1 mm to up to 3 mm comprising:
carrying out pulsed laser weld of said Nb sheet/component joints from inside in the RF field region of said SCRF cavity achieving a depth of weld penetration of more than 1 mm to full depth of up to 3 mm of the said thickness of said Nb sheet/components welded following the steps of:
providing the said Nb sheet/components for said pulsed laser weld joining with the butting edges thereof for welding in a vacuum vessel in inert atmosphere and carrying out two step laser welding of said butting edges of said components following:
a first phase of controlled key hole welding targeted at achieving said depth of weld penetration comprising (a) carrying out keyhole welding from inside surface of cavity wall of RF field region formed of said butting edges using a single laser beam with varying the temporal profile of pulsed laser including an initial preheating of surface for desired penetration and tapering off the energy near the end such as to achieve said desired depth of weld penetration of welding from inside thereby minimising the heat affected zone defects and (b) sucking out evaporated plasma materials from laser and said Nb sheet/component metal at weld joint; followed by
a second phase of conduction welding targeted only at achieving a smooth surface finish of weld joint enabling desired SCRF activity comprising (a) carrying out conduction welding also from inside surface of said keyhole weld joint obtained in said first phase using two inclined laser beams for weld joint smooth surface finish and also facilitating weld plume rise perpendicular to the weld joint surface and (b) sucking out said weld plume using suction arrangement to thereby provide for said laser weld joint of said Nb sheet/components in the RF field region from inside enabling SCRF cavities with laser weld joints having wall thickness over 1 mm to up to 3 mm to perform desired SCRF activity.

2. A method as claimed in claim 1 wherein said variation in the temporal profile of pulsed laser comprises carrying out keyhole welding comprised of depositing major energy in keyhole welding phase comprising:
i) providing only requisite amount of energy and controlling the rate of heating by keeping pulse frequency low, and ii) depositing energy with variation in time domain.

3. A method as claimed in claim 1 comprising carrying out laser welding of the iris joint of SCRF cavity from inside surface of the wall of the iris joint components between two half cells to form dumbbells of SCRF cavity comprising:
providing the half-cells held together in an iris welding rig comprising a vacuum vessel;
carrying out in the first phase (i) keyhole welding from inside surface of the wall of RF field region involving a nozzle having three concentric cylindrical tubes, the laser beam passing through the innermost tube, the outermost and innermost tube supplying gas at high velocity and the middle tube connected to suction port, selecting the welding parameters such that pulse profile is varied in time phase to obtain full depth penetration with minimum distortion and minimum heat affected zone; followed by (ii) in the second phase carrying out the conduction welding to smoothen the weld surface obtained in the first phase, involving inclined nozzles brought at the level of joint wherein the beams are inclined and the weld plume rises perpendicular to the surface, the evaporated material formed because of laser material interaction being sucked out through a material suction arrangement in form of an enclosure.

4. A method as claimed in claim 1 comprising carrying out laser welding of equator joint of single cell cavity or dumbbells constituting the multi-cell SCRF cavity from inside surface of the wall of cavity comprising:
providing the dumbbells in insert and carrying the same inside an equator welding rig comprising a vacuum vessel with devices and/or attachments for carrying out the welding from inside surface of the wall of the cavity;
welding the equator joints one after the other performing a two step welding operation comprising:
(i) in the first phase carrying out keyhole welding with a laser beam inclined at an angle to the vertical in the plane of welding in the range of 15° to 45°, the energy being varied in time phase for desired penetration and followed by (ii) in the second phase carrying out conduction welding involving said dual beam with beam inclination from the vertical in the range of 30° to 60° in order to obtain a very smooth finish after keyhole-welding operation is over, the evaporated material from laser material interaction rising up perpendicular to the surface of the joint and being collected by a suction arrangement in the form of an enclosure.

5. A method as claimed in claim 4 wherein the welding methodology comprises of the sequence, viewing butting edges—keyhole welding—viewing—repairing—viewing—dual beam conduction welding/smoothening—viewing the entire region with boroscope—laser cleaning—final smoothening with defocused laser—final inspection with boroscope.

6. A method as claimed in claim 1 wherein said keyhole welding is carried out involving a welding nozzle comprising three concentric tube type enclosure adapted to move up and down, the outermost and inner most tube enclosure adapted to provide high velocity inert gas to flow out whereas the middle enclosure is adapted to suck out the evaporated material due to laser material interaction and wherein said conduction welding is carried out involving the dual beam whereby the evaporated material as a result of the laser material interaction rises up perpendicular to the surface of the joint and is collected by a separate enclosure adapted to move up and down.

7. A method as claimed in claim 1 wherein the end group component joints, which are in RF field free region, are welded from outside surface of the wall of cavity involving keyhole welding only and the ones, which are in RF field region, are welded by a combination of keyhole and conduction welding from inside surface of the wall of cavity.

8. A method of producing Niobium based superconducting radio frequency (SCRF) cavities as claimed in claim 1 wherein Nd:YAG or any other solid state laser is used for laser welding.

9. A method of producing Niobium based super conducting radio frequency (SCRF) cavities as claimed in claim 1 comprising carrying out of said laser welding for maximizing depth of penetration and minimizing heat affected zone (HAZ), involving temporal variation in energy within the pulse and selective repetition rate of the said laser pulse.

10. A method of producing Niobium based super conducting radio frequency (SCRF) cavities as claimed in claim 1 wherein temporal profile of the pulse is tailored for Niobium or its alloys preferably by varying the energy within the pulse in time domain in a near trapezoidal shape such that initial preheating of surface results in higher penetration and tapering off the energy near the end is done in such a way to avoid micro cracks/porosity/other defects, whereby the overall pulse shape ensures high penetration depth and low heat affected zone.

11. A method as claimed in claim 1 wherein the laser beam is incident at an angle to the surface such that the major evaporated plasma materials from laser-material interactions is ejected along a small solid angle and is sucked out through evacuation nozzle.

12. A method as claimed in claim 1 comprising carrying out the said keyhole welding and conduction welding involving inclined laser beam with selective beam inclination for achieving desired penetration with good surface finish wherein for said keyhole welding the angle of inclination of the beam from the vertical is in the range of 15 to 45° preferably 30° to vertical and for conduction welding the beam inclination from the vertical is in the range of 30 to 60° preferably 45° to vertical.

13. A method as claimed in claim 1 comprising carrying out the keyhole welding joints comprising welding by a laser beam striking at an inclination/normal to the surface being welded by a welding nozzle with three concentric openings wherein gas is purged from the innermost and outermost openings while evaporated materials from laser-material interaction is sucked out by the middle opening adapted as an evacuation chamber.

14. A method as claimed in claim 1 comprising the step of smoothening of surface of joints involving low intensity defocused pulse laser beam adapted to penetrate only up to the modulations on the surface.

15. A method as claimed in claim 1 comprising cleaning the weld region and surroundings involving short pulses of nano-second duration preferably laser pulses of low intensity preferably in the region of 1-100 nano seconds and energy density in the range of about 1-5 J/cm$^2$ and involving methodology to also facilitate sucking out of evaporating material due to laser material interaction.

16. A method as claimed in claim 1 wherein the wall thickness of the material being welded is more than 1 mm and the welding is done by means of laser welding from inside surface or outside surface of the wall of cavity having depth of welding ranging from greater than half the thickness to full depth of the material being welded.

* * * * *